(12) United States Patent
Gutsche et al.

(10) Patent No.: US 7,138,677 B2
(45) Date of Patent: Nov. 21, 2006

(54) CAPACITOR ARRANGEMENT WITH CAPACITORS ARRANGED ONE IN THE OTHER

(75) Inventors: Martin Gutsche, Dorfen (DE); Harald Seidl, Poering (DE)

(73) Assignee: Infineon Technologies AG, Munich (DE)

( * ) Notice: Subject to any disclaimer, the term of this patent is extended or adjusted under 35 U.S.C. 154(b) by 18 days.

(21) Appl. No.: 10/787,934

(22) Filed: Feb. 27, 2004

(65) Prior Publication Data

US 2004/0228067 A1 Nov. 18, 2004

(30) Foreign Application Priority Data

Feb. 28, 2003 (DE) .................. 103 08 888

(51) Int. Cl.
*H01L 27/108* (2006.01)
(52) U.S. Cl. .............. 257/305; 257/E27.092; 257/E27.084
(58) Field of Classification Search ........ 257/301, 257/305, E21.653, E27.084, E27.089, E27.092
See application file for complete search history.

(56) References Cited

U.S. PATENT DOCUMENTS

| | | | | |
|---|---|---|---|---|
| 3,793,475 A | * | 2/1974 | Yonkers | 174/73.1 |
| 5,354,701 A | * | 10/1994 | Chao | 438/244 |
| 5,444,599 A | * | 8/1995 | Dupraz et al. | 361/274.1 |
| 5,874,757 A | * | 2/1999 | Chao | 257/303 |
| 5,950,084 A | | 9/1999 | Chao | |
| 6,117,790 A | | 9/2000 | Schäfer et al. | |
| 2002/0030218 A1 | | 3/2002 | Adkisson et al. | |

* cited by examiner

Primary Examiner—Thomas L. Dickey
(74) Attorney, Agent, or Firm—Slater & Matsil, L.L.P.

(57) ABSTRACT

Arrangement of capacitors which, without taking up an additional area in the semiconductor substrate, have an increased capacitance compared with conventional capacitors in DRAM memory cells. The arrangement of capacitors according to the invention is based on a combination of two or more separately arranged individual capacitors in or on a substrate to form two or more capacitors arranged one in the other or one above the other. In this case, an outer capacitor encloses at least one or a plurality of inner. capacitors or a substantial part of an upper capacitor lies above a lower capacitor. A method for fabricating the arrangement of capacitors also is described.

22 Claims, 16 Drawing Sheets

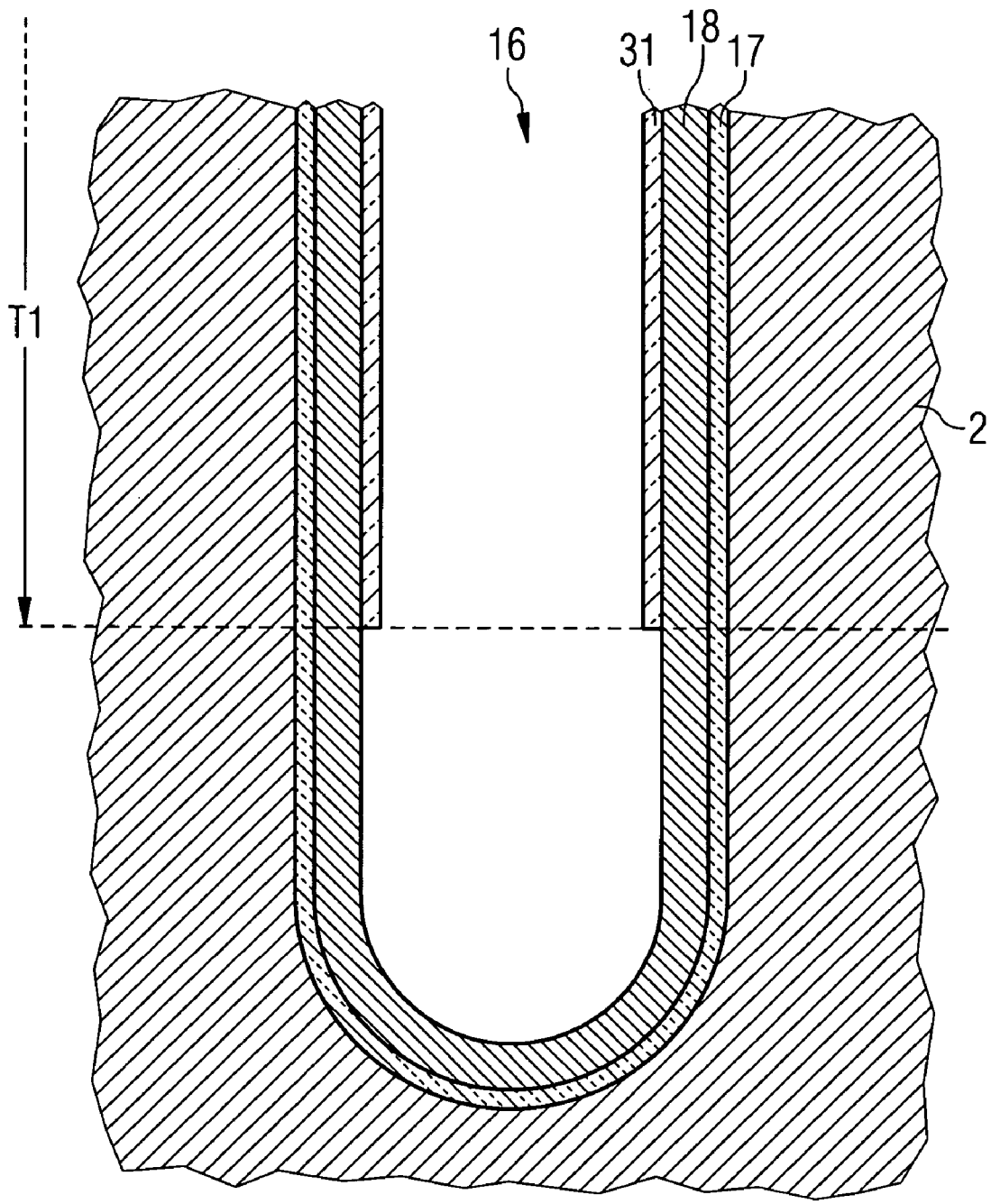

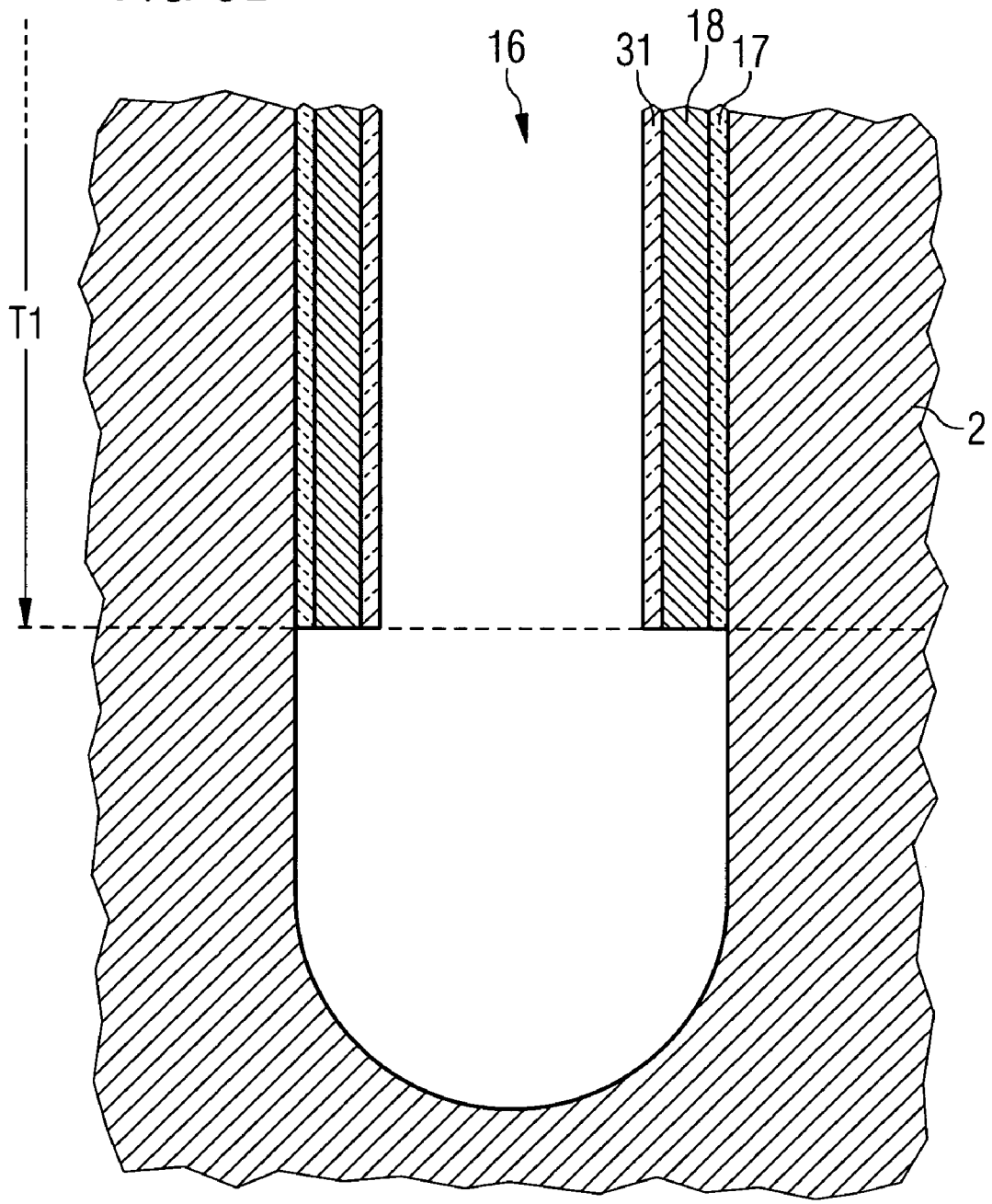

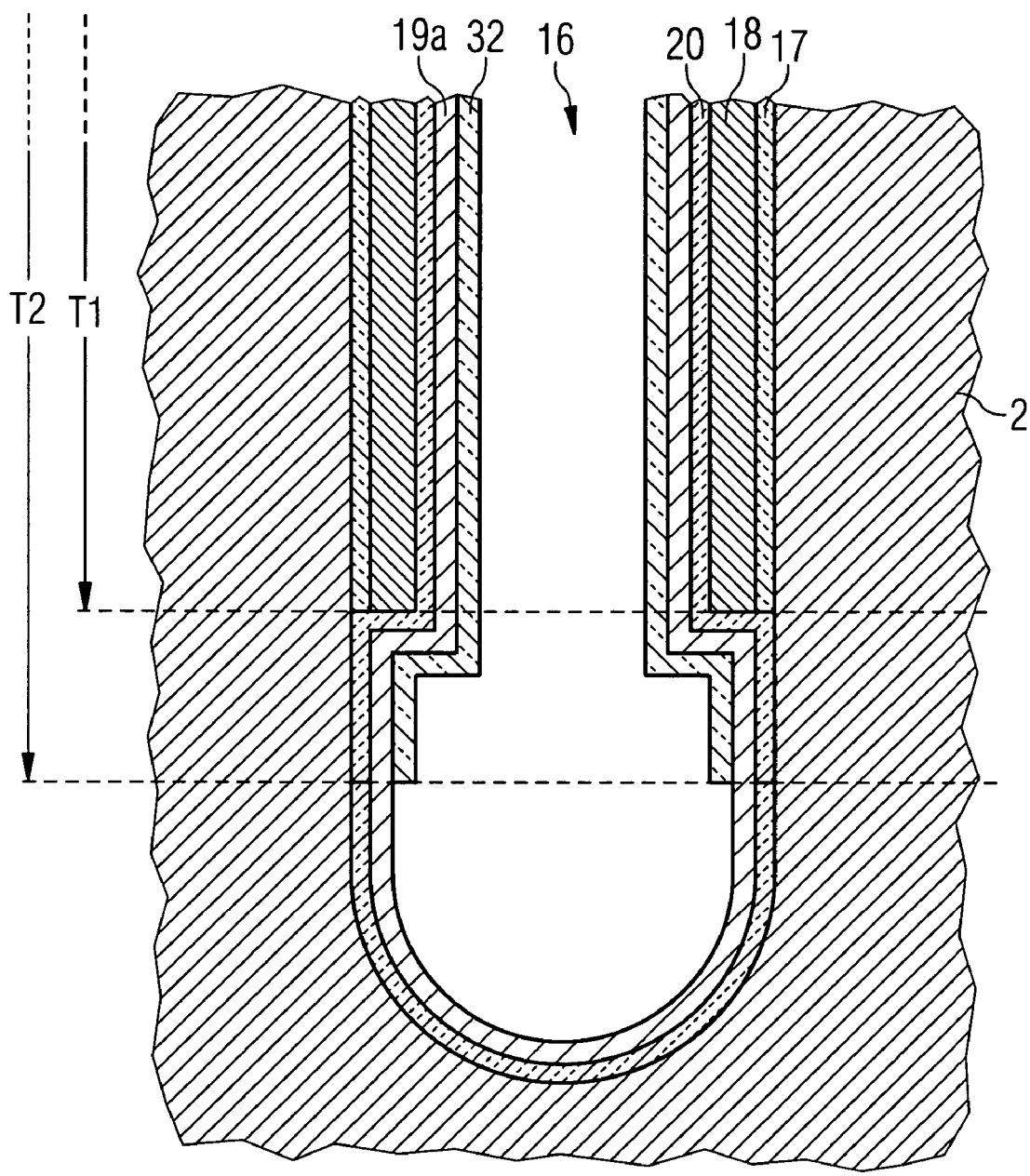

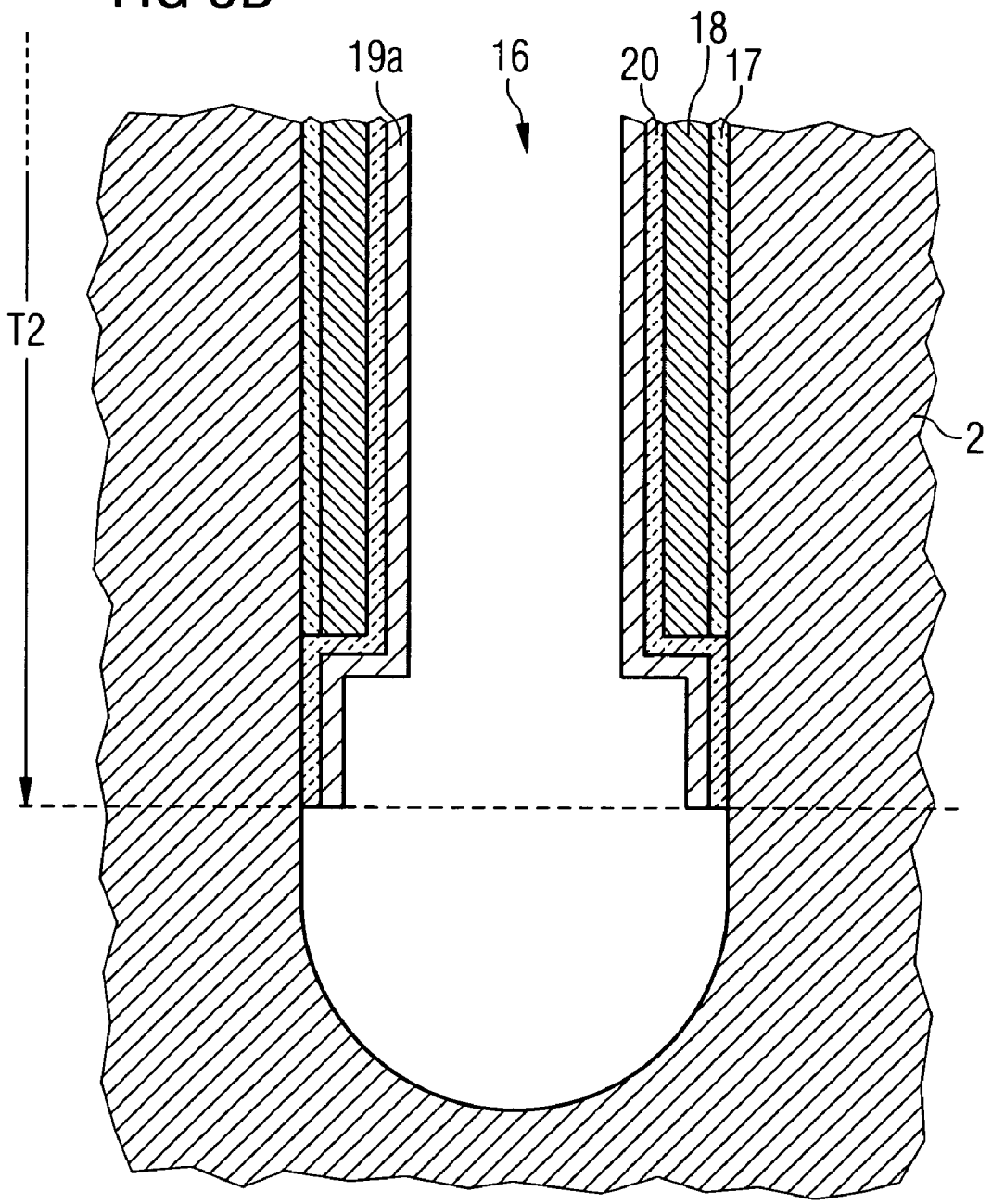

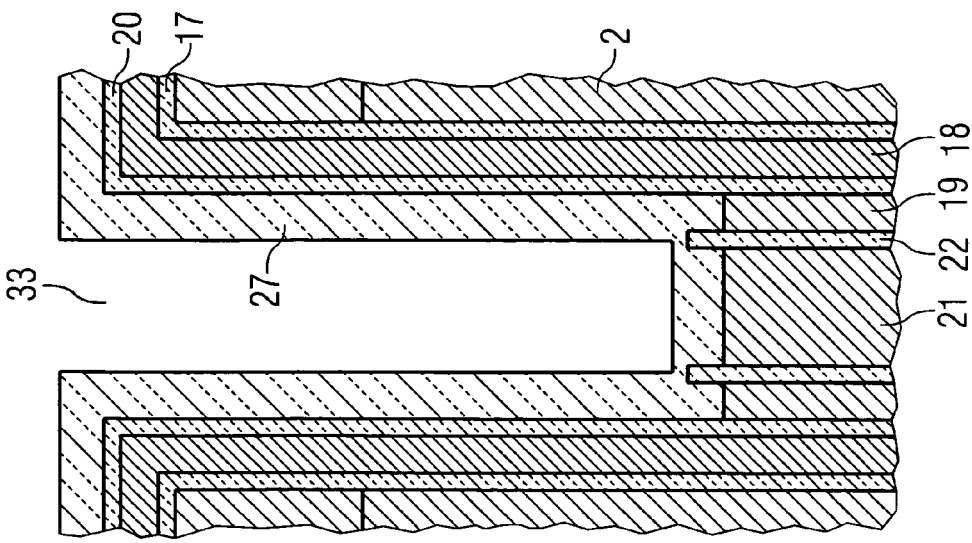
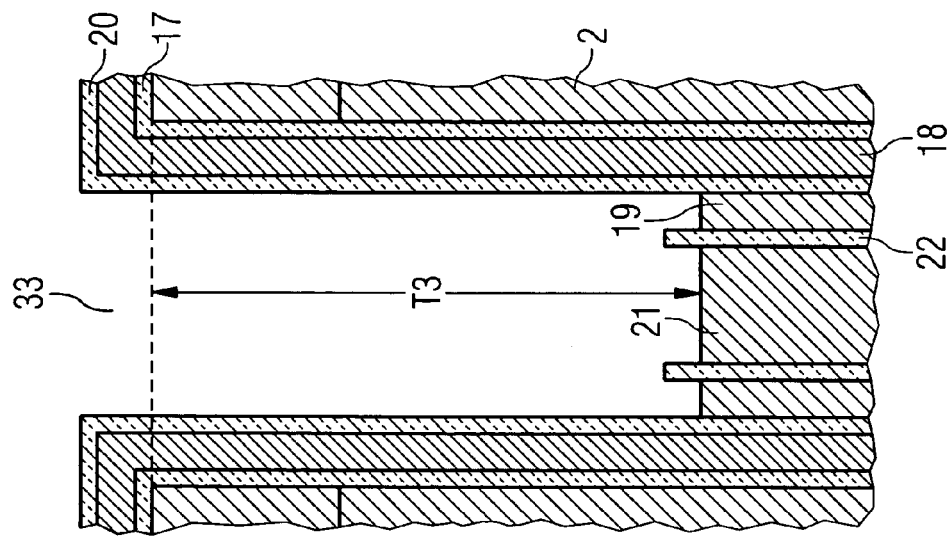
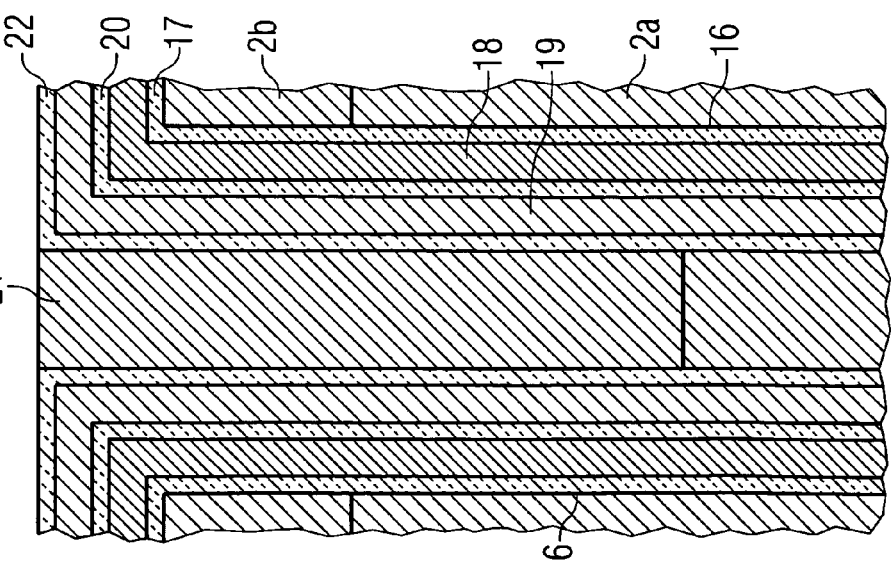

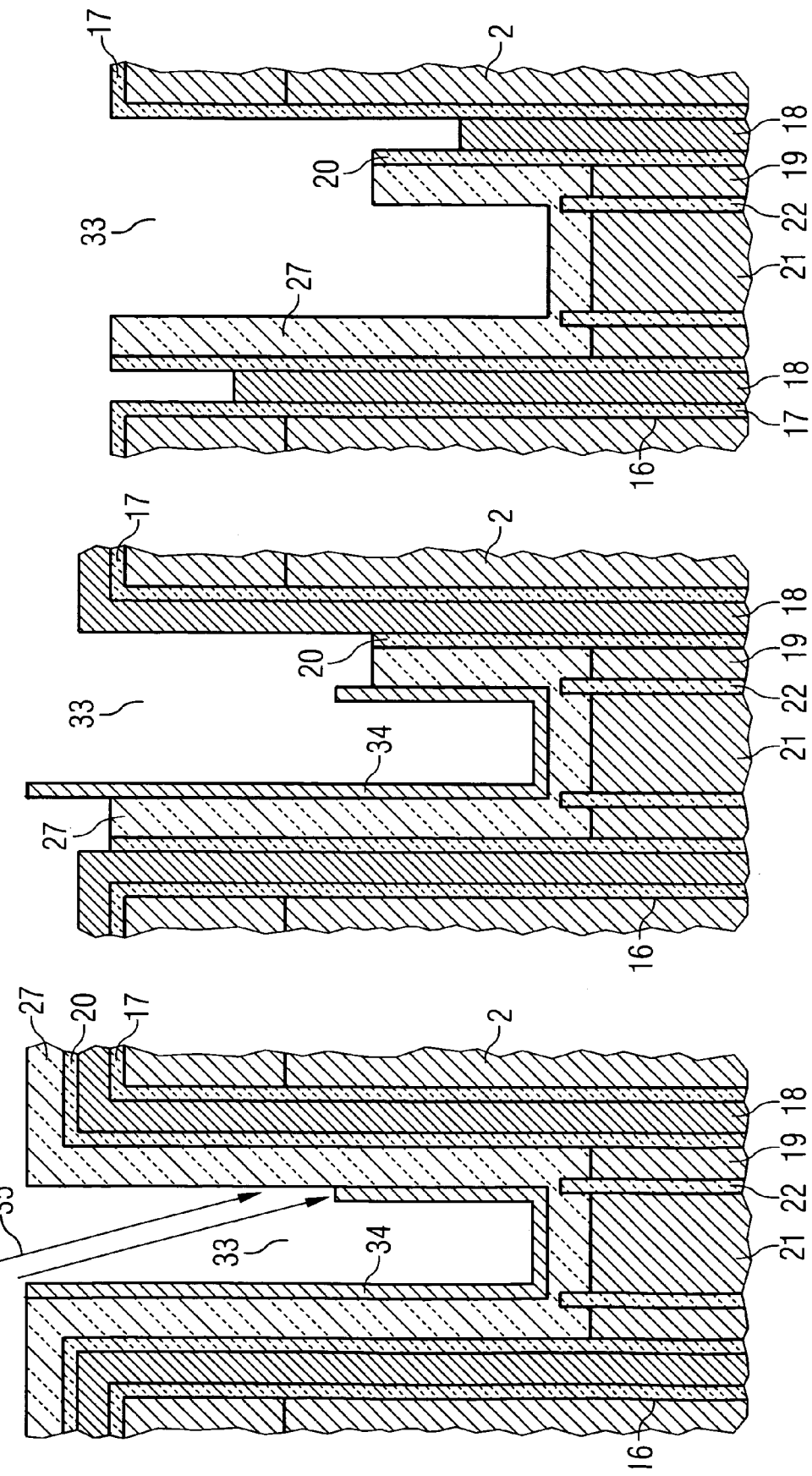

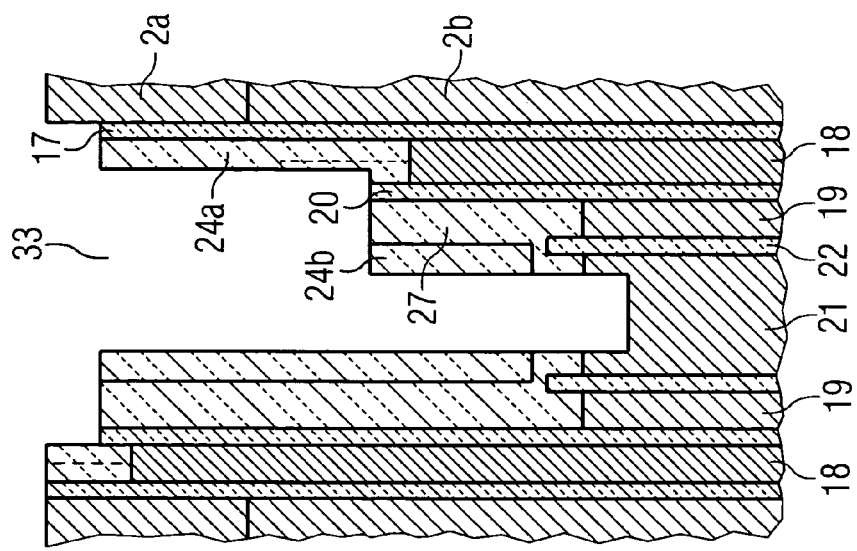
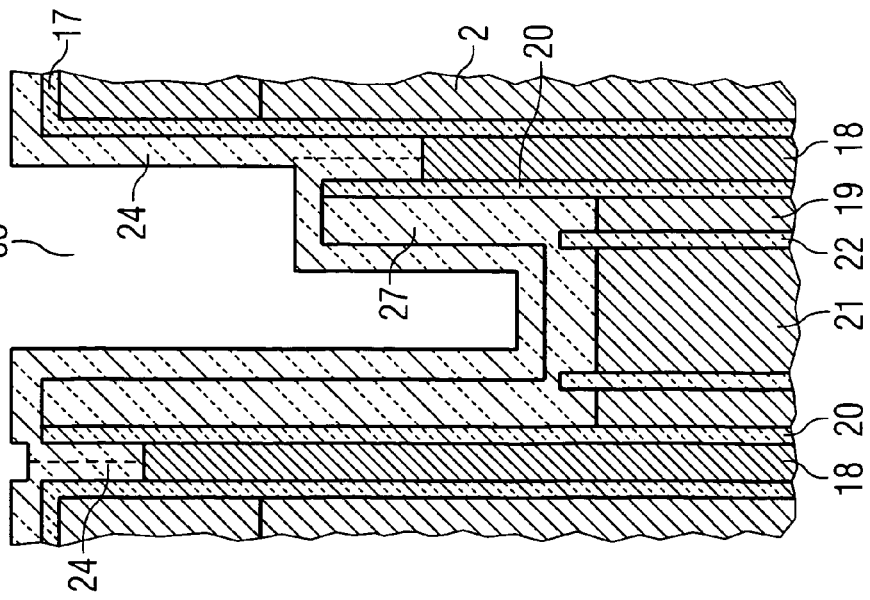

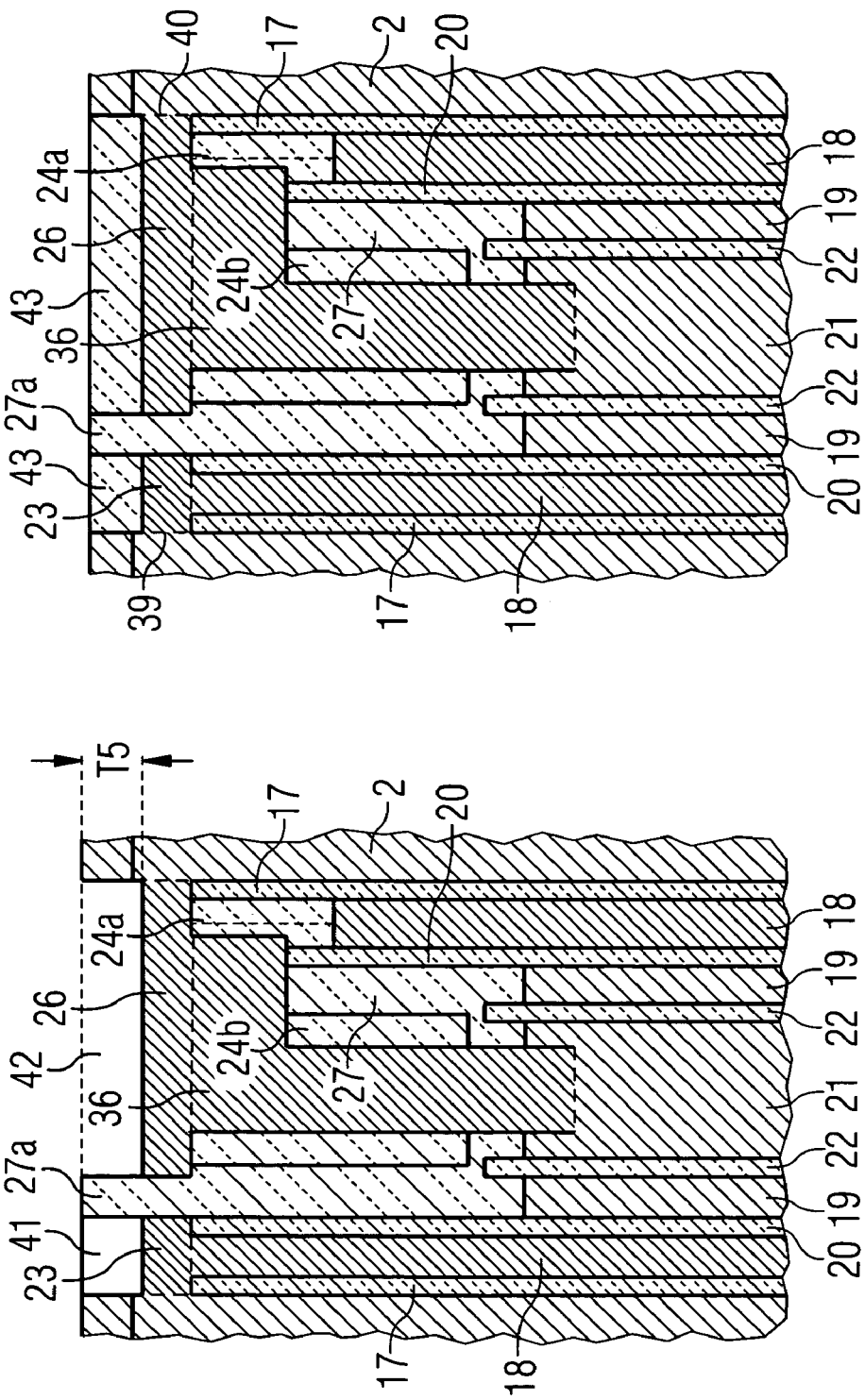

CAPACITOR ARRANGEMENT WITH CAPACITORS ARRANGED ONE IN THE OTHER

FIELD

The invention relates to an arrangement of at least two capacitors in or on a semiconductor substrate and to a method for fabricating the capacitor arrangement.

BACKGROUND

DRAM (dynamic random access memory) modules are fabricated in increasingly large volumes, for a wide variety of computer applications. As computer processing capabilities continue to improve, recent generation DRAM modules are required to have an ever-increasing storage density, to thereby achieve smaller dimensions while containing a larger number of memory cells for storing data. This results in a need to further reduce the cell size of individual memory cells, comprised of a storage capacitance and a selection transistor. Depending upon the arrangement of the storage capacitance, e.g., in the silicon substrate or below the transistors used for driving purposes or above the substrate surface or above the transistors, a distinction is made between memory cells of a "trench capacitor" type and of a "stacked capacitor" type.

In the case of a memory cell of the "trench capacitor" type, a trench is formed in a monocrystalline semiconductor substrate, with a capacitor being introduced into the trench step-by-step. By means of outdiffusion, for example, a doped region is first formed in regions of the semiconductor substrate that adjoin the trench wall. The regions form a first outer electrode in the completed capacitor. A thin layer of a dielectric, such as a nitride/oxide layer, is then deposited along the trench wall. A second, inner electrode may subsequently be formed as a counterelectrode by deposition of highly doped polycrystalline silicon in the remaining cavity of the trench. Afterward, in the region of the semiconductor substrate near the surface and above the capacitor, a transistor and associated interconnects are produced, which can be used to control the charge state of the capacitor.

In a memory cell of the "stacked capacitor" type, the control electronics, including a selection transistor and interconnects for driving the memory cell, are first constructed in or on a monocrystalline semiconductor substrate. Afterward, a dielectric layer may be applied, such as on the semiconductor substrate surface, having a thickness that corresponds at least to the extent of the capacitor in the direction perpendicular to the surface of the semiconductor substrate. A cavity in the form of a trench is then introduced into said dielectric layer, said cavity reaching as far as the previously constructed control electronics or the corresponding connections. In a manner comparable with the fabrication of a trench capacitor, a capacitor is subsequently constructed by step-by-step deposition of outer electrode, dielectric and inner electrode in the cavity.

The fabrication of a stacked capacitor as explained here is to be regarded only as by way of example. There are a multiplicity of different concepts for a stacked capacitor, which, however, are based on common features. The transistor controlling the charge state of the stacked capacitor is arranged below the stacked capacitor, in contrast to the trench capacitor. Both trench capacitor and stacked capacitor thus follows similar principles in terms of their construction. Both use an extent perpendicular to the surface of the semiconductor substrate and achieve an enlargement of the electrode area by virtue of the capacitor being as it were "folded".

Reducing the cell size leads to capacitors having a smaller cross section, for which reason the area of the electrodes also decreases, which ultimately leads to capacitors having a lower electrical capacitance. In order to compensate for the loss of capacitance, it is necessary to increase the capacitance again in a different way by means of complicated new process techniques. Examples thereof are capacitors with a higher doping of the electrodes in order to reduce the charge carrier depletion or the use of dielectrics having a high dielectric constant. The surfaces of the electrodes can be enlarged, for example, by applying additional structures (HSG, hemispherical grains) on the trench wall.

A further possibility for increasing the capacitance consists, in the case of trench capacitors, in enlarging the surface of the trench by means of a bottle-like extension in a lower section of the trench. The trench thus extends in the depth of the semiconductor substrate also partially into regions of the semiconductor substrate which are located below a selection transistor formed on the surface of the semiconductor substrate.

Stacked capacitors manifest in principle the same difficulties when reducing the cross section of the capacitor. In this case, too, the electrode area and thus the capacitance of the capacitor decrease as the cross section decreases.

Given feature sizes of less than a hundred nanometers, the capacitance of the capacitors which are currently used in commercial microchips, for a predetermined cross section, can be increased by the abovementioned methods only by a value which is typically below 50%. In order to satisfy the requirements made of future chip generations, however, a far greater increase in the capacitance is necessary, or, to put it another way, a capacitance remaining approximately the same per memory cell has to be made available as the feature size of the capacitors which are integrated in a microchip decreases.

SUMMARY

An arrangement of capacitors is disclosed that makes available an increased capacitance for the same space or basic area requirement as conventional capacitor arrangements.

An arrangement is described of at least two capacitors in or on a substrate, wherein the capacitors are arranged one in the other, an outer capacitor at least partially enclosing at least one inner capacitor. An arrangement is also described of at least two capacitors in or on a substrate, wherein the capacitors are arranged at least partially one above the other.

A method is described for fabricating an arrangement of capacitors. According to the method, a substrate is provided and a trench is introduced into the substrate, which trench forms a trench wall with respect to the substrate. A first dielectric layer is shaped on the trench wall, and a first electrode layer is applied to the first dielectric layer, said first electrode layer at least partially covering the first dielectric layer. A second dielectric layer is applied to the trench wall, the first electrode layer being covered by the second dielectric layer. A second electrode layer is applied to the trench wall and a second contact is produced between the second electrode layer and the substrate. The second electrode layer is completely covered with a third dielectric layer. The cavity that still remains is filled with a third electrode layer, and a first contact to the first electrode layer and also a third contact to the third electrode layer are fabricated.

The invention is explained in more detail below with reference to figures, identical reference symbols being used for mutually corresponding components. In the figures:

DETAILED DESCRIPTION OF THE INVENTION

Figure 1A:
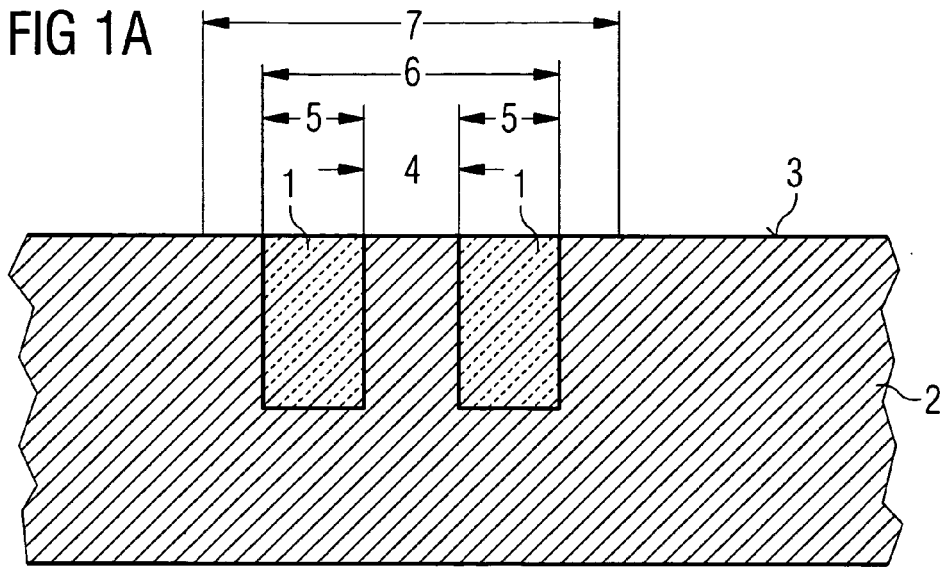
FIG. 1A diagrammatically shows an arrangement of two capacitors 1 in a semiconductor substrate 2.

The following reference symbols are used consistently throughout the description of the drawings:

1 Capacitor
2 Substrate
3 Substrate surface
4 Distance
5 Diameter
6 Area
7 Area requirement
8 Outer capacitor
9 Inner capacitor
10 Diameter
11 Diameter
12 Trench
13 Periphery
14 Outer capacitor
15 Inner capacitor
16 Trench
17 First dielectric layer
18 First electrode layer
19 Second electrode layer
20 Second dielectric layer
21 Third electrode layer
22 Third dielectric layer
23 Conductive section
24 Second insulator layer
25 Conductive section
26 Conductive section
27 First insulator layer
28 Insulation layer
29 First contact point
30 Third contact point
31 First etching mask
32 Second etching mask
33 Cavity
34 Silicon layer
35 Ion beam
36 Electrode material
37 Depression
38 Depression
39 Contact area
40 Contact area
41 Filling space
42 Filling space
43 Covering oxide FIG. 1A diagrammatically shows an arrangement of two capacitors 1 in a semiconductor substrate 2. In this case, the capacitors 1 are embodied as trench capacitors, i.e. they extend below a substrate surface 3 into the depth of the substrate 2. For the sake of clarity, the illustration does not show the components required for driving the capacitors 1, such as selection transistors and corresponding interconnects. Equally, there is no detailed illustration of the individual layers of the capacitors 1, such as electrode layers and dielectric layers. The capacitors 1 have a distance 4 and also a diameter 5, which means that an area 6 which is at least taken up by the two capacitors 1 results on the surface 3 of the substrate 2. In order to obtain the area requirement for the arrangement of two capacitors 1 the minimum distance from adjacent capacitators or memory cells must also be taken into account, so that the area 7 is obtained as the area requirement. If this area 7 is to be reduced, it is possible to reduce the distance 4 or the diameter 5 of the capacitors 1. However, this also reduces the structural size of the capacitors 1 and, due to the reduction of the also the capacitance of the capacitors 1.

Figure 1B:
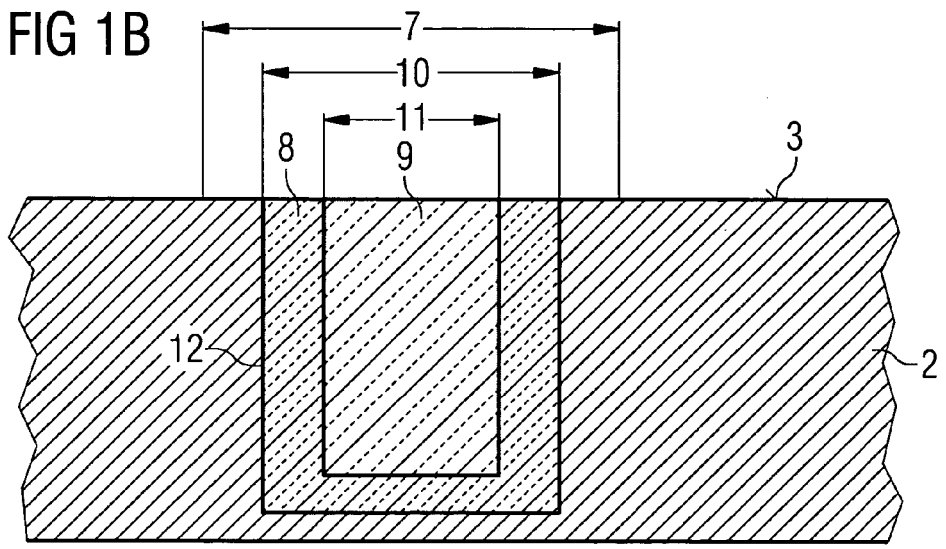
FIG. 1B diagrammatically illustrates a capacitor arrangement according to an embodiment of the invention.

FIG. 1B diagrammatically illustrates a capacitor arrangement according to an embodiment of the invention. Here, too, the illustration does not show the components for driving the capacitors nor is there a detailed illustration of the individual constituent parts of the capacitor. The arrangement comprises an outer capacitor 8 and also an inner capacitor 9. The two capacitors 8, 9 are in each case embodied as trench capacitors in a substrate 2. Below a substrate surface 3, the outer capacitor 8 encloses the inner capacitor 9, so that the capacitors 8, 9 are arranged "one in the other" in the sense of the invention. The two capacitors 8, 9 again take up an area 7 on the substrate surface 3, which area 7 corresponds to the area 7. shown in FIG. 1A in the case of the arrangement shown.

The capacitor arrangements shown in FIGS. 1A and 1B in each case have the same area requirements 7 on the surface 3 of the substrate 2. The distance from adjacent capacitors which is necessary in order to obtain no interactions between the capacitors is assumed to be identical in the arrangements illustrated in FIGS. 1A and 1B. In the capacitor arrangement according to an embodiment of the invention as illustrated in FIG. 1B, the outer capacitor 8 has a diameter 10 corresponding to the diameter of the area 6, and the inner capacitor 9 has a diameter 11. In this case, both the diameter 10 of the outer capacitor 8 and the diameter 11 of the inner capacitor 9 are greater than the diameter 5 of the capacitors 1 illustrated in FIG. 1A. The larger diameter of the capacitors 8, 9 also results in larger electrode areas and thus, for the same thickness of the electrode layers or dielectric layers, a higher capacitance in comparison with the capacitors illustrated in FIG. 1A. By virtue of the larger diameter 10 of the outer capacitor 8 in comparison with the diameter 5, the trench 12 introduced into the substrate 2 for the construction of the capacitors 8, 9 may also be embodied into a significantly greater depth than is possible in the case of the capacitors 1 illustrated in FIG. 1A. As a result, for the same aspect ratio, the electrode area of the capacitors 8, 9 can be increased further, as a result of which the capacitance can be increased further in comparison with the capacitors illustrated in FIG. 1A.

The arrangement of the capacitors 8, 9 nested one in the other thus enables a very much larger structure width with the requirement for the area 10 remaining the same and thus, for the same aspect ratio, also the patterning of a deeper trench. This makes it possible to fabricate capacitors with a significantly enlarged electrode surface and, as a result, with a significantly increased capacitance.

Figure 1C:
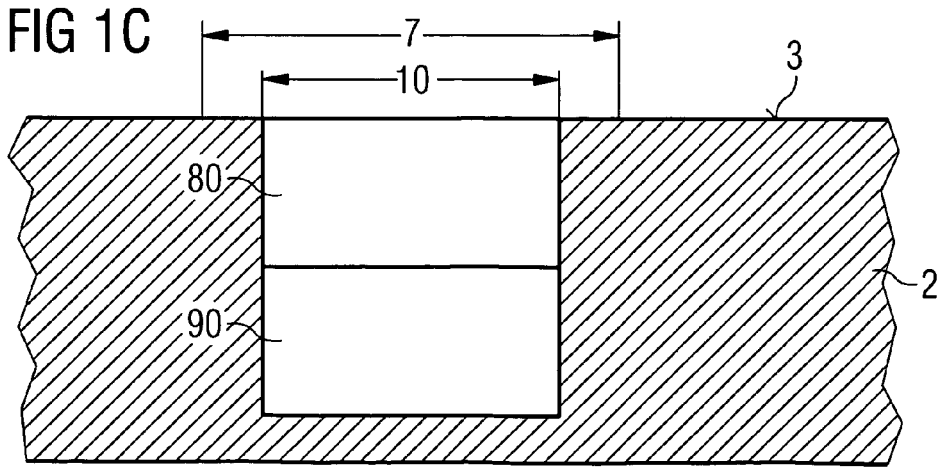
FIG. 1C shows an arrangement of capacitors according to an embodiment of the invention, in which the capacitors are arranged one above the other.

FIG. 1C shows an arrangement of capacitors according to an embodiment of the invention, in which the capacitors are arranged one above the other. The arrangement may be interpreted as an extreme variant of the arrangement shown in FIG. 1B, inner capacitor 9, and outer capacitor 8, being offset in the direction of their longitudinal axis to an extent such that they are arranged one above the other. The arrangement then comprises a lower capacitor 90 and also an upper capacitor 80. In this case, too, the same basic area which is taken up by the two capacitors 1 in FIG. 1A is available for both capacitors 80, 90.

Figure 2:
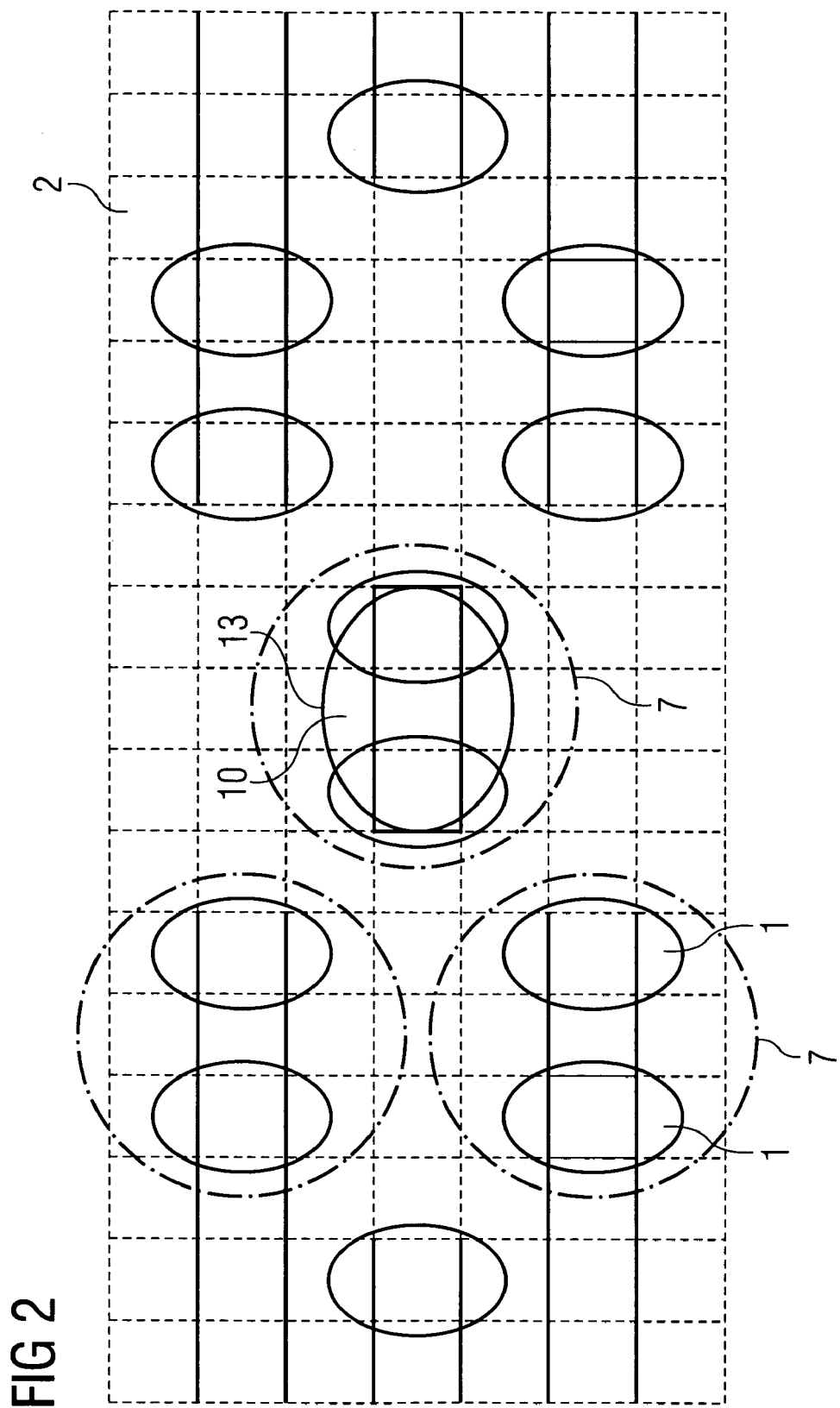
FIG. 2 shows a diagrammatic plan view of a semiconductor substrate, capacitors in a conventional arrangement and in an arrangement according to the invention being integrated into said semiconductor substrate.

FIG. 2 shows a plan view—corresponding to FIGS. 1A and 1B—of the surface of a semiconductor substrate 2. On the one hand, trench capacitors 1 arranged in pairs are integrated into the semiconductor substrate 2. This corresponds to the arrangement illustrated in FIG. 1A. The outer periphery 13 of an area 10, which is occupied by the arrangement of capacitors according to the invention, is depicted for comparison purposes. The minimum area requirement 7, which precludes interactions with adjacent capacitors, is depicted as a broken line for both arrangements.

It is evident that, for the same area requirement 7 on the substrate surface, the electrodes of the capacitor arrangement according to the invention have a significantly larger periphery in comparison with the capacitors 1 and thus also a significantly larger electrode area. The mutually opposite lateral contact connection—described further below—of the two capacitors which are arranged one in the other and are arranged within the periphery 13 makes it possible to continue to utilize the conventional layout of interconnects and selection transistors.

In FIG. 1B, the capacitor arrangement according to an embodiment of the invention is arranged in a trench whose side walls essentially run perpendicularly from the upper trench opening as far as the lower end of the trench. The area of the trench opening arranged at the substrate surface thus essentially corresponds throughout to the area of a cross section through the trench which is arranged perpendicular to the longitudinal axis of the trench, that is to say parallel to the substrate surface 3. However, the trench may be extended in bottle-shaped fashion in the depth of the substrate 2. In this case the trench may be extended (not illustrated) below the substrate surface for example as far as the area requirement 7 illustrated in FIG. 1B. In FIG. 2, the broken line 7 would then correspond to the periphery of the bottle-shaped extension introduced into the substrate. An expansion of the trench in the depth of the substrate 2 may be achieved for instance by means of an isotropic etching below a specific level (bottle etching).

As is explained below, with the area requirement in the semiconductor substrate remaining the same, capacitance increases in comparison with separately arranged capacitors by up to a factor of approximately 2 are possible in the case of two capacitors arranged one in the other.

Conventional capacitors 1 arranged separately in pairs with an elliptical cross-sectional area typically have, after a possible isotropic expansion, a dimensioning of 1.6 F for the short axis and 2.4 F for the long axis of the ellipse, where F denotes a smallest structure width to be patterned. A trench in which the capacitors which are arranged concentrically one in the other according to the invention are accommodated may have, after an isotropic expansion below a protected region, approximately a dimensioning of 3.2 F for the short axis and 4.0 F for the long axis of the ellipse. In this case, the elliptical cross-sectional area 10 of this trench approximately corresponds to the total area taken up by the two capacitors 1 arranged separately in pairs. The trench periphery 7 in the expanded part in the depth of the substrate is thus enlarged by a factor of 1.8 compared with the conventional separately arranged capacitors 1. With the aspect ratio remaining the same, the larger extent of the trench in which the capacitors arranged one in the other are accommodated enables the trench depth to be increased by approximately a factor of 1.5. An enlargement of the electrode areas by a factor of approximately 2.7 can thus be obtained overall with the arrangement according to the invention. On average, however, the capacitors which are arranged one in the other according to the invention in each case reach only 70% of the total depth of the trench as usable depth, which means that a capacitance increase by a factor of about 1.9 results for the arrangement of capacitors according to the invention in comparison with two separately arranged capacitors.

Figure 3:
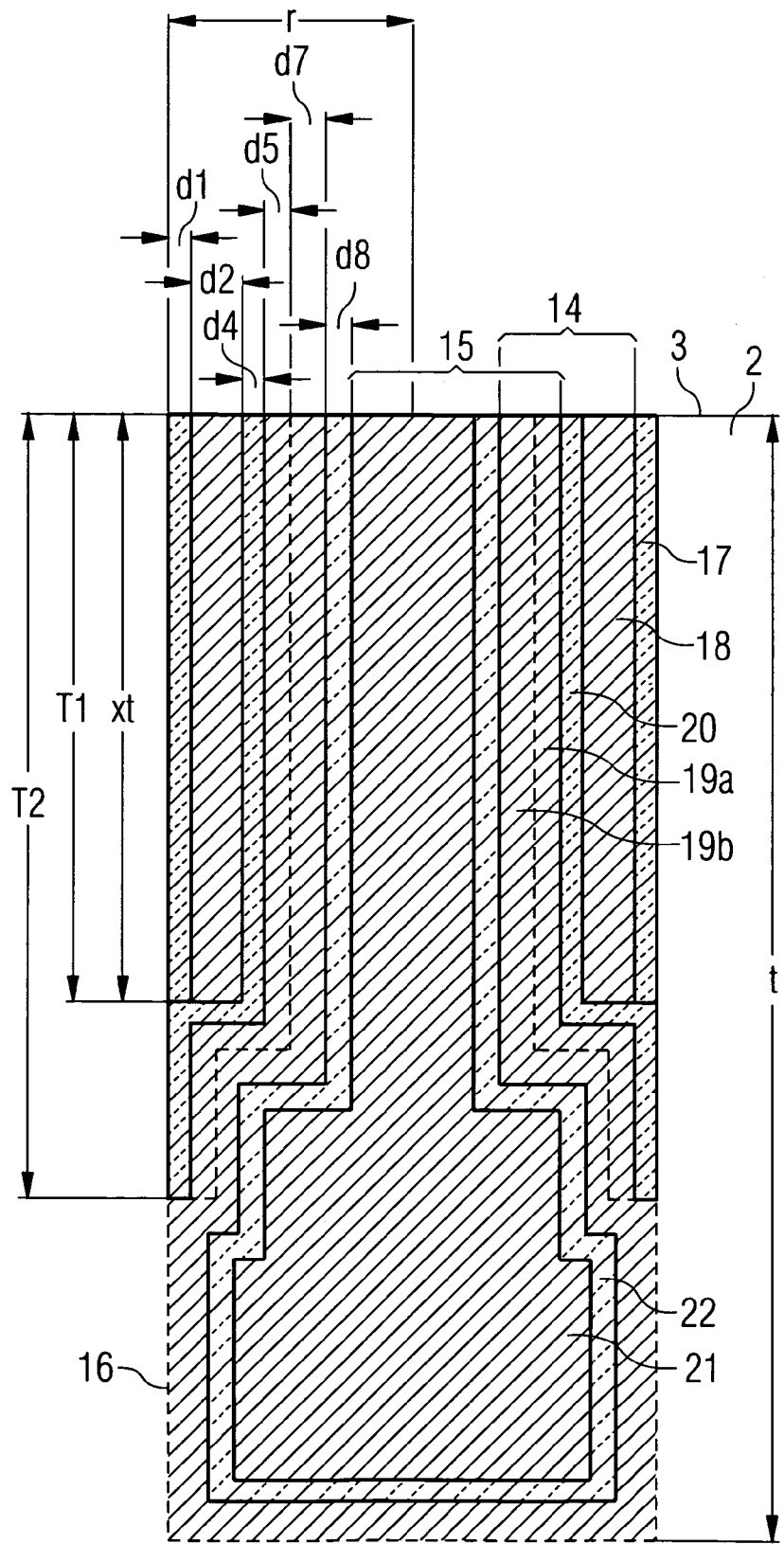
FIG. 3 shows a diagrammatic longitudinal section through an arrangement of capacitors according to the invention.

A configuration according to an embodiment of the invention of two capacitors arranged one in the other is illustrated in FIG. 3. Two capacitors, an outer capacitor 14 and an inner capacitor 15, are arranged concentrically one in the other in a trench 16 introduced into a substrate 2. In an upper section, the trench 16 is provided with a first dielectric layer 17, which is arranged on the wall of the trench 16. The outer capacitor 14 in each case comprises the first and second electrode layers 18 and 19, between which a second dielectric layer 20 is arranged. In this case, the first electrode layer 18 extends as far as a structure depth T1. The inner capacitor 15 comprises the second and third electrode layers 19 and 21, between which the third dielectric layer 22 is arranged. Outer capacitor 14 and inner capacitor 15 jointly comprise the second electrode layer 19, which is at the potential of the substrate 2. For this purpose, the second electrode layer 19 is routed onto the substrate 2 at a structure depth T2 and bears on the trench wall formed by the semiconductor substrate 2 in a lower section of the trench 16 below the structure depth T2.

In detail, the capacitor arrangement illustrated in FIG. 3 comprises, from the outside inward, a first dielectric layer 17 having a thickness d1, which insulates the capacitor from the substrate 2. The first dielectric layer 17 is adjoined by a first electrode layer 18 having a thickness d2, which is assigned to the outer capacitor 14 and serves as a first electrode. The first electrode layer 18 is surrounded, toward the center of the capacitor arrangement and also downwardly, by a second dielectric layer 20 having a thickness d4, which insulates the first electrode layer 18 together with the first dielectric layer 17 toward the surroundings. The second dielectric layer 20 is followed by a second electrode layer 19, which, in FIG. 3, is diagrammatically subdivided into a first part 19a of the second electrode layer having a thickness d5 and also a second part 19b of the second electrode layer having a thickness d7. The explanation of the sections 19a, 19b will be discussed further below. The second electrode layer 19 is routed into the substrate 2 in its lower section. On its inner area, the second electrode layer 19 is covered by a third dielectric layer 22 having a thickness d8. The remaining cavity is filled by an inner third electrode layer 21.

For the sake of clarity, the illustration does not show additional insulation layers in the collar region of the trench, which are necessary in order to insulate the connections of the capacitors arranged one in the other from the reference potential in the depth. Such collar oxides are analogously already used in conventional trench capacitors.

Inner and outer capacitors 14, 15 preferably have the same capacitance. In this case, the capacitance is controlled by way of the extent of the electrode layers into the depth of the trench 16. The extent of the first, second and third electrode layers 18, 19, 21 is explained in more detail below.

Outer and inner capacitors 14, 15 are patterned in a cylindrical trench 16 have a depth t and a radius r. The outer capacitor 14 reaches into the trench 16 as far as a depth xt, where x is that proportion of the depth of the trench 16 which is available to the outer capacitor and may assume values between zero and one. The inner capacitor 15 reaches into the trench 16 as far as a depth t. In this case, the second electrode layer 19 is situated directly on the semiconductor substrate 2. The arrangement described ensures that the two capacitors 14, 15 are isolated from one another by the second electrode layer 19 at reference potential.

A capacitance of capacitors is proportional to the electrode areas thereof. For the outer capacitor 14, these are two cylinder lateral areas assigned to the first electrode layer 18, an outer and an inner cylinder lateral area having the respective radii $r1=r-\frac{1}{2}*d1$ and $r2=r-d1-d2-\frac{1}{2}*d4$ and having a length xt. The capacitance of the outer capacitor 14 is therefore given to an approximation by $C_a=(C/A)*(2\pi*r1*xt+2\pi*r2*xt)$, where C/A denotes the specific capacitance (capacitance per unit area). The electrode area assigned to the inner capacitor 15 is composed of two cylinder lateral areas assigned to the third electrode layer 21. In one region of the length xt, it has the radius $r3=r-d1-d2-d4-d5-d7-\frac{1}{2}*d8$ and, in the second region of the length t-xt, it has the average radius $r4=r-\frac{1}{2}*d4-\frac{1}{2}*d5-d7-\frac{1}{2}*d8$. The capacitance of the inner capacitor 15 is then given to an approximation by $$C_i=(C/A)*(2\pi*(r3)*(xt)+2\pi*(r4)*(1-x)*t).$$

Assuming that the first (17), the second (20) and the third (22) dielectric layers have the same thickness d and the outer capacitor 14 and also the inner capacitor 15 have the same capacitance, the proportion x of the depth or of the height t of the trench 16 which is reached by the first capacitor into the trench 16 can be specified by $$x=((r-\tfrac{1}{2}*d5-d7-d)/(2r+\tfrac{1}{2}*d5-\tfrac{1}{2}*d)).$$

Figure 4:
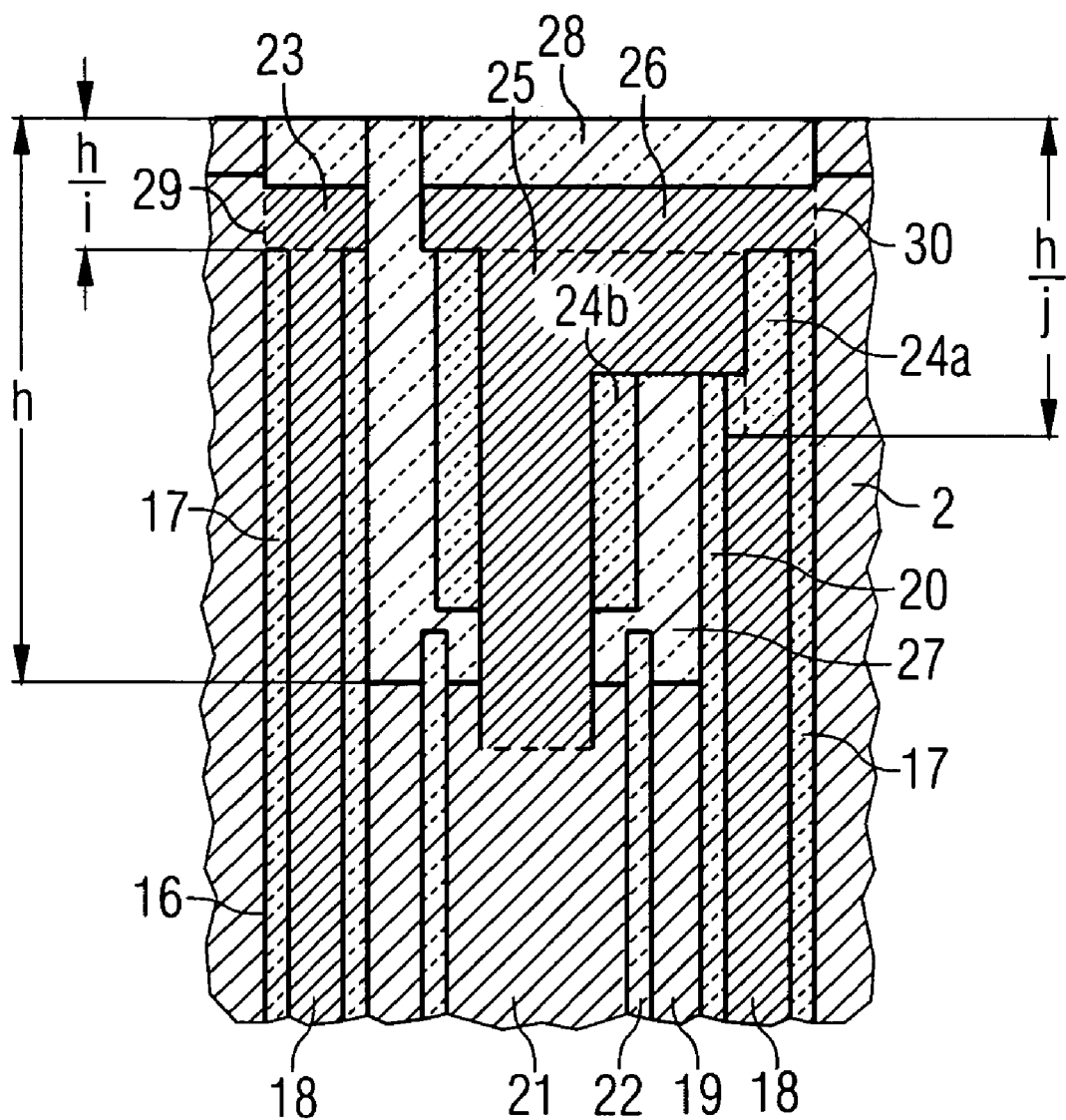
FIG. 4 shows a diagrammatic longitudinal section through a region of the arrangement of capacitors according to the invention near the substrate surface.

For the driving of the arrangement of capacitors 14 and 15 illustrated in FIG. 3, the individual electrodes have to be connected to an assigned selection transistor or the word line and bit line. FIG. 4 diagrammatically illustrates the asymmetrical contact connection of the electrodes of the arrangement of capacitors according to the invention. The contact connection illustrated in FIG. 4 is embodied in the upper section of the arrangement illustrated in FIG. 3. The lower section corresponding to that of the illustration from FIG. 3 is therefore not illustrated in FIG. 4.

The second electrode layer 19 is at reference potential, the electrical connection, as illustrated in FIG. 3, being embodied as a second contact in the lower section of the trench 16. The electrical connections to the first electrode layer 18 and to the third electrode layer 21 are embodied in the upper section of the trench 16 in the direction of the substrate top side. Since the outwardly arranged first electrode layer 18 cylindrically surrounds the inwardly arranged third electrode layer 21, the electrical connections to the respective electrode layers have to be routed in such a way that the electrode layers or the leads thereof are electrically insulated from one another. Therefore, the connection of the first electrode layer 18 and of the third electrode layer 21 is embodied in such a way that the connection of the first electrode layer 18, in the case of the arrangement illustrated in FIG. 4, is routed out to the left-hand side, while the connection of the third electrode 3 is routed out to the right-hand side. The electrical connection of the inner third electrode layer 21 can therefore be routed toward the outside over the outwardly arranged first electrode layer 18 and be electrically insulated from the outer first electrode layer 18 or the connection thereof.

In detail, in the arrangement illustrated in FIG. 4, the connection of the first electrode layer 18 is effected in the upper left-hand section of the illustration from FIG. 4 via the conductive section 23, which forms a first contact. Said conductive section 23 covers only a section of the upper periphery of the first electrode layer 18. In the rest of the upper periphery of the first electrode layer 18, the latter is insulated by the second insulator layer 23. In this region prescribed by the second insulator layer 24a, the electrical connection to the inwardly arranged third electrode layer 21 can then be routed toward the outside. The electrical connection of the inwardly arranged third electrode layer 21 is effected via the conductive sections 25 and 26, which forms a third contact. In the arrangement illustrated in FIG. 4, the conductive section 26 is routed toward the right-hand side over the second insulator layer 24a, so that the third electrode layer 21 and the conductive sections 25 and 26 are electrically insulated from the first electrode layer 18. On the one hand, the conductive sections 23 and 26 and, on the other hand, the second electrode layer 19 and the third electrode layer 21 are electrically insulated from one another by the second insulator layer 24a and the first insulator layer 27. Finally, the arrangement is terminated toward the substrate top side by the insulation layer 28.

As a result of the spatial requirement for the connections to the outer first electrode layer 18 and to the inner third electrode layer 21, the upper termination of the second electrode layer 19 illustrated in FIG. 3, third dielectric layer 22 and also third electrode layer 21 is correspondingly set back into the trench 16 by a distance h. The third dielectric layer 22 and the third electrode layer 21 now no longer have a length of t, but rather only a length of essentially t-h. The first electrode layer 18 and the first dielectric layer 17 have a length of essentially xt-h/i. On the right-hand side of the arrangement illustrated in FIG. 4, the first electrode layer 18 is reduced even further and has a length of essentially xt-h/j, where j is greater than 1 and less than i. This is necessary for the contact connection of the third electrode layer 21 assigned to the inner capacitor 15. On the opposite side, a conductive layer 23 made e.g. of electrode material is applied to the first electrode layer 18 and to the first dielectric layer 17 and the second dielectric layer 20, said conductive layer producing a first contact to the first electrode layer 18 which is open toward the left-hand side of the illustration. The remaining cavities are partially filled with a first and a second insulator layer 27, 24. A conductive section 25 in the form of an upside down L, for the contact connection of the third electrode layer 21, is introduced into the insulator layers 27 and 24. This is carried out in a manner such that the laterally arranged first contact point 29 of the first electrode layer 18 and the third contact point 30 of the third electrode layer 21 are arranged essentially opposite one another at the periphery of the opening of the trench 16.

For reasons of clarity, the illustration does not show further insulation layers in the collar region in the form of collar oxides or STI isolation. Possible collar insulation includes, in particular, buried collar oxides, but in principle e.g. also SOI. The collar insulation is necessary in order to isolate the connections 29 and 30 from the reference potential in the depth of the substrate. A further lateral insulation is ensured by STI structures.

The advantage of the contact connection illustrated in FIG. 4 is that the arrangement of capacitors according to the invention can further be used for a conventional layout for the arrangement of capacitors and transistors for the production of DRAM memory cells.

Accordingly, an arrangement of two capacitors in or on a substrate is characterized by the fact that the capacitors are arranged one in the other, an outer capacitor at least partially enclosing at least one inner capacitor. The embodiments of the invention use a particular arrangement of capacitors. Instead of arranging individual capacitors separately next to one another in (trench capacitor) or on (stacked capacitor) a semiconductor substrate the capacitors are arranged one in the other. In this case, an outer capacitor at least partially encloses at least one inner capacitor. In an alternative solution approach, the capacitors are arranged at least partially one above the other.

Advantages of the arrangement according to the exemplary embodiments of the invention is that both periphery and structural height of the capacitor can be considerably increased for the same basic area requirement compared with individual capacitors arranged separately next to one another. The basic area requirement is determined by the area which, in a plan view of the surface of the semiconductor substrate, is enclosed by an arrangement comprising at least two capacitors, without interactions with adjacent memory cells occurring. In other words, the basic area requirement of the capacitor arrangement is determined by the maximum extent of the capacitors in a plane which runs parallel to the substrate surface, supplemented by in each case half the distance to the adjacent memory cell which has to be complied with in order to avoid interactions between the memory cells. The area requirement of the capacitor arrangement on the substrate surface is to be differentiated from this. This area requirement is determined by the area taken up by the capacitor arrangement on the substrate top side. This area generally corresponds to the area of the opening for example of the trench which is introduced into the semiconductor substrate for the fabrication of a trench capacitor. Approximately at least the sum of the basic areas which are taken up by the individual capacitors when the latter are arranged conventionally next to one another is available for the cross section of the outer capacitor. If the hitherto customary arrangement of the capacitors next to one another is compared with the invention's arrangement of the capacitors one in the other or one above the other, then for the same thickness of the dielectric layers and electrode layers of the capacitors, owing to the increased capacitor periphery, an increase in the capacitance results both for the inner (or lower) and for the outer (or upper) capacitor of the capacitor arrangement according to the invention. With the aspect ratio remaining the same, this being the ratio of depth (trench capacitor) or height (stack capacitor) to width of a structure, it is possible, on account of the increased capacitor periphery, additionally to obtain even higher or deeper capacitor structures, which leads to a further enlargement of the surface and thus to a further increase in the capacitance of the capacitors. A considerable increase in the capacitor capacitance can thus be achieved by the arrangement according to the invention, without the size of a DRAM memory cell having to be increased for this purpose. Furthermore, the requirements made of lithography and etching methods are relaxed on account of the enlarged dimensions of the structures. Existing installations can therefore also be utilized for further generations of miniaturized memory cells.

Generally, the capacitors are concentrically arranged one in the other or one above the other. The electrodes of the capacitors or the dielectric layers usually have approximately the form of a hollow cylinder or, in the case of the innermost electrode, the form of a solid cylinder with an elliptical, circular or rectangular cross section, the hollow cylinders having a uniform layer thickness. The individual cylinders which form the electrodes or the dielectric layers then extend along a common axis. During the fabrication of the capacitor arrangement according the invention, the individual layers are deposited in each case with as uniform a layer thickness as possible on the walls of the trench introduced into the semiconductor substrate or, during the fabrication of a stacked capacitor arrangement, at the walls of the corresponding trench introduced into the dielectric layer, or, more clearly, of the corresponding upwardly projecting cylindrical construct.

Preferably the capacitors have an elliptical or circular cross section at least at the substrate surface. Trenches or openings with an elliptical or circular cross section can be produced in a simple manner by means of customary etching methods. A rectangular cross section can be achieved e.g. subsequently by means of a wet-chemical etching which preferably produces specific surfaces in the silicon. Moreover, in the case of such trenches, a deposition of layers with a uniform layer thickness can be achieved in a comparatively simple manner by means of suitable methods.

Preferably, the capacitor arrangement according to the invention comprises two capacitors, an inner or lower capacitor, and also an outer or upper capacitor, which encloses the inner capacitor or, respectively, is arranged above the lower capacitor. Preferably, outer and inner or lower and upper capacitors comprise a common electrode. Said electrode is generally at a reference potential and is arranged between inner and outer capacitors.

In a preferred capacitor arrangement, outer and inner capacitors are arranged concentrically one in the other and comprise, from the outside inward, a first dielectric layer having a thickness $d1$, a first electrode layer having a thickness $d2$, which is assigned to the outer capacitor and acts as a first electrode, a second dielectric layer having a thickness $d4$, a second electrode layer having a thickness $d5+d7$, which acts as a second electrode, a third dielectric layer having a thickness $d8$, and a third electrode layer, which is assigned to the inner capacitor and acts as a third electrode. In this case, the second electrode layer forms a counterelectrode with respect to the first electrode assigned to the outer capacitor and with respect to the third electrode assigned to the inner capacitor. The second electrode layer is at the reference potential and isolates inner and outer capacitors from one another.

If the above-described capacitor arrangement is embodied as a stacked capacitor, the first dielectric layer may also be formed by the dielectric layer which is firstly deposited on the semiconductor substrate and into which a trench for the construction of the capacitor is then introduced. The first dielectric layer thus corresponds to the trench wall in this case. As an alternative, a thin electrode layer may firstly be deposited before the first dielectric layer is formed.

Preferably, however, the capacitor arrangement is formed as an arrangement of trench capacitors in a semiconductor substrate.

In an arrangement as trench capacitors, in a preferred embodiment, the first electrode layer extends above a structure depth T1 along the wall of the trench and the second electrode layer is routed below the structure depth T1 onto the semiconductor substrate.

A substrate depth T is understood to be a distance between a substrate surface and a plane in the substrate arranged parallel to the substrate surface. A substrate top side is understood to be that side of a substrate from which electronic components are integrated into the substrate. Trenches introduced into the substrate are therefore open toward the substrate top side.

The trench introduced into a semiconductor substrate is subdivided, by a plane defined by the structure depth T1, into an upper section extending above the structure depth T1 as far as the trench opening at the surface of the semiconductor substrate, and also a lower section extending below the structure depth T1 as far as the lower termination of the trench. The first electrode layer extends above the structure depth T1 along the trench wall. It is electrically insulated from the second electrode layer by the second dielectric layer. First dielectric layer, first electrode layer, second dielectric layer and second electrode layer are thus arranged above the structure depth T1 in sandwich-like fashion on the trench wall. The first electrode layer ends at the trench depth determined by the structure depth T1. Below the structure depth T1, the second electrode layer is routed onto the semiconductor substrate, which preferably forms the wall of the trench. It is thereby possible to fabricate an electrical connection between semiconductor substrate and second electrode layer. In the completed capacitor arrangement, the second electrode is thereby put at the reference potential.

In a particularly preferred embodiment, the second electrode layer runs below the structure depth T1 at least in sections along the trench wall and is arranged directly on the semiconductor substrate. In this case, the second electrode is routed in such a way that it is electrically insulated from the first electrode.

A structure depth T2 is preferably designed for this purpose. The plane defined by the structure depth T2 lies in the trench below the plane defined by the structure depth T1. The second dielectric layer then extends as far as the structure depth T2. Below the structure depth T2, the semiconductor substrate is uncovered at the wall of the trench. The second electrode layer arranged on the second dielectric layer is therefore insulated from the first electrode layer above the structure depth T2 and, below the structure depth T2, is routed onto the semiconductor substrate. The second electrode layer therefore forms a contact with the semiconductor substrate, which contact is designated as second contact hereinafter.

First, second and third dielectric layers preferably have the same thickness, i.e. $d1=d4=d8$ holds true.

The thickness of the individual layers is preferably chosen to be as small as possible in order to achieve a high capacitance of the capacitors and furthermore a smallest possible diameter of the entire capacitor arrangement in order in this way to enable a good scalability to even smaller cell sizes. On the other hand, the thickness of the dielectric layers must not be chosen to be so small that the capacitor are prematurely distanced by tunnel effects. Generally, the layer thickness is chosen in the range of 2 to 20 nm. Layer thicknesses in the range of 3 to 8 nm are suitable for applications in a DRAM memory cell, in which the dielectric is made of $Al_2O_3$, for example.

In a particular preferred embodiment, inner capacitor and outer capacitor have the same capacitance. Given the same distance between the electrodes, i.e. the same layer thickness of the dielectric layer, the capacitance is determined by the electrode area. The area of the first or third electrode layer which is available for generating a capacitance is therefore chosen such that the capacitance of the inner or outer capacitor is the same. It is also inherently possible to match capacitances of the inner and outer capacitors e.g. by means of a different layer thickness of the second or third dielectric layer or by using different dielectrics. However, these possibilities have only little significance in practical application.

The contact connection of the electrodes of the capacitor arrangement according to the invention is preferably carried out in such a way that provision is made of a first contact to the first electrode layer and a third contact to the third electrode layer, first and third contacts being arranged at opposite sides of the trench periphery.

For this purpose, the contact of the third electrode, which forms the inner electrode of the capacitor arrangement according to the invention, is routed toward the outside over the first and second electrodes arranged further outward. The second electrode is generally at reference potential, the contact connection to the substrate being effected in the lower section of the trench via a second contact. In the case of trench capacitors, the contact to the first and third electrodes is embodied in the upper section of the trench, preferably adjacent to the substrate surface, since the selection transistors which individually drive the capacitors are generally also arranged in this region. An upper section is understood to be a section of the trench which essentially adjoins the opening of the trench. A lower section is correspondingly understood to be section which is essentially arranged at that end of the trench which is opposite to the opening of the trench.

First and third electrode have to be electrically insulated from one another in order to be able to individually drive the capacitors. Therefore, in the contact connection of the third electrode, the procedure is generally such that the upper termination of the first electrode layer is set back into the trench at a side opposite to the first contact at the periphery of the trench. A section which is not covered by the first electrode layer is thereby produced near to the upper termination of the trench wall. In this section, the third contact, by means of which the third electrode is contact-connected, can be routed toward the outside from the interior of the capacitor arrangement over the upper termination of the first electrode layer. What is achieved by this arrangement is that the first contact to the first electrode and the third contact to the third electrode are opposite one another at the periphery of the trench. A further advantage of such contact connection is that, in comparison with an arrangement of two capacitors arranged next to one another as used hitherto, the capacitor arrangement according to the invention does not require a change in the layout with regard to the arrangement of selection transistors and the contact connection thereof. Large parts of the layout used hitherto can therefore be adopted for the production of DRAM memory cells which use the capacitor arrangement according to an embodiment of the invention.

Certain steps for fabricating an arrangement of two capacitors according to an exemplary embodiment of the invention, arranged one in the other, are illustrated in FIG. 5A to G. Firstly, a trench 16 is introduced into a semiconductor substrate 2 by means of customary etching techniques. Afterward, a first dielectric layer 17 covering all the walls of the trench 16 is deposited by means of conformal deposition, for example by means of a CVD (CVD=Chemical Vapor Deposition) or ALD method (ALD=Atomic Layer Deposition). A first electrode layer 18 is applied to the first dielectric layer 17 over the whole area by means of a conformal deposition process.

For the patterning of the first electrode layer 18 and of the first dielectric layer 17, a first layer, which serves as a first etching mask 31 and reaches as far as a structure depth T1, is then applied to the first electrode layer 18. The first etching mask 31 may be produced by means of short-time pulses for example using a nonconformal ALD method.

Afterward, as is shown in FIG. 5B, the first electrode layer 18 and the first dielectric layer 17 are removed in the lower region of the trench 16 arranged below the structure depth T1, in the sections which are not covered by the first etching mask 31. Thus, the substrate 2 is now uncovered again in the lower section of the trench 16. the first etching mask 31 is then removed again. As an alternative, the etching mask may also be removed together with the dielectric layer 17.

As is illustrated in FIG. 5C, a second dielectric layer 20 is then deposited onto the first electrode layer 18 and also the areas of the substrate 2 which are uncovered in the lower section of the trench 16. The first electrode layer 18 is then encapsulated by the dielectric layers 17 and 20. Equally, all the uncovered substrate areas in the lower section of the trench 16 are covered by the second dielectric layer 20.

A first part 19a of the second electrode layer 19, which first part completely covers the second dielectric layer 20, is subsequently deposited as a thin layer. For further patterning, a layer serving as a second etching mask 32 is deposited onto the thin layer forming the first part 19a of the second electrode layer 19. Said second etching mask 32 may likewise be applied by means of short-time pulses using nonconformal ALD deposition. The second etching mask 32 extends from the upper edge of the trench 16 as far as a structure depth T2 below the lower termination of the first electrode layer 18, which is arranged at the structure depth T1.

Afterward, the sections of the second dielectric layer 20 and of the first part 19a of the second dielectric layer which are not covered by the second etching mask 32 are removed again, so that the surface of the semiconductor substrate 2 is uncovered again in the lower section of the trench 16. Afterward, as is illustrated in FIG. 5D, the layer servicing as a second etching mask 32 is removed again. As an alternative, the etching mask may also be removed jointly with the dielectric layer 20.

Figure 5E:
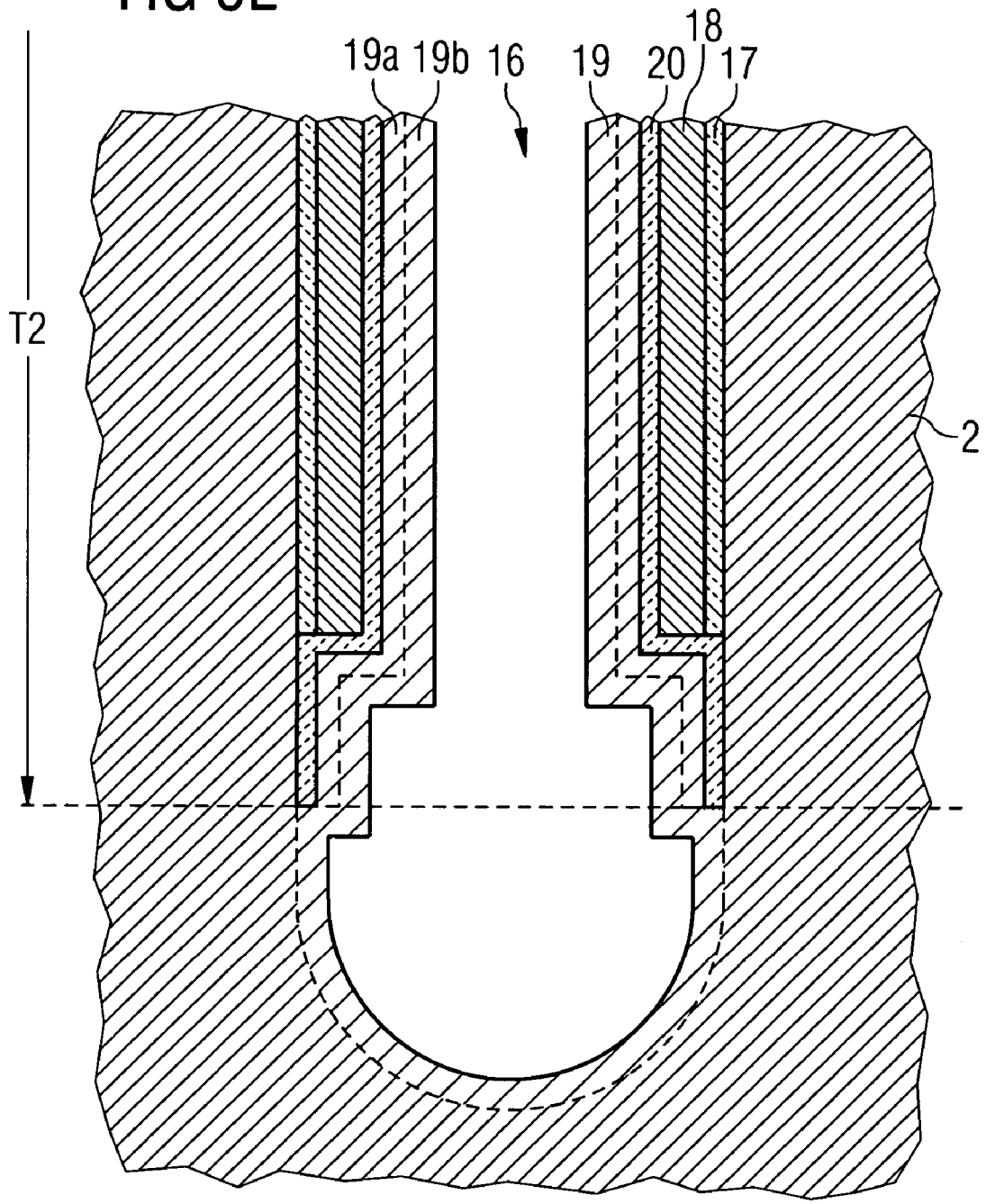
FIG. 5 shows a diagrammatic process sequence for fabricating the arrangement of capacitors according to the invention.

A second part 19b of the second electrode layer 19 is then deposited onto all the uncovered areas in the trench 16. As illustrated in FIG. 5E, the second part 19b, in the upper section of the trench 16, supplements the first part 19a to form the second electrode layer 19. In the lower section of the trench 16, the second part 19b of the second electrode layer 19 is arranged directly on the surface of the semiconductor substrate 2. In the finished capacitor arrangement, the second electrode layer 19 is thus at the potential of the substrate 2. The outer capacitor is constructed by means of the work steps carried out previously.

In order to form the layers 17, 18, 20 in such a way that they cover the side walls of the trench only as far as a defined structure depth T1, T2, the relevant layers may also be deposited directly by means of a nonconformal ALD method. The etching masks can be dispensed with in this way.

Figure 5F:
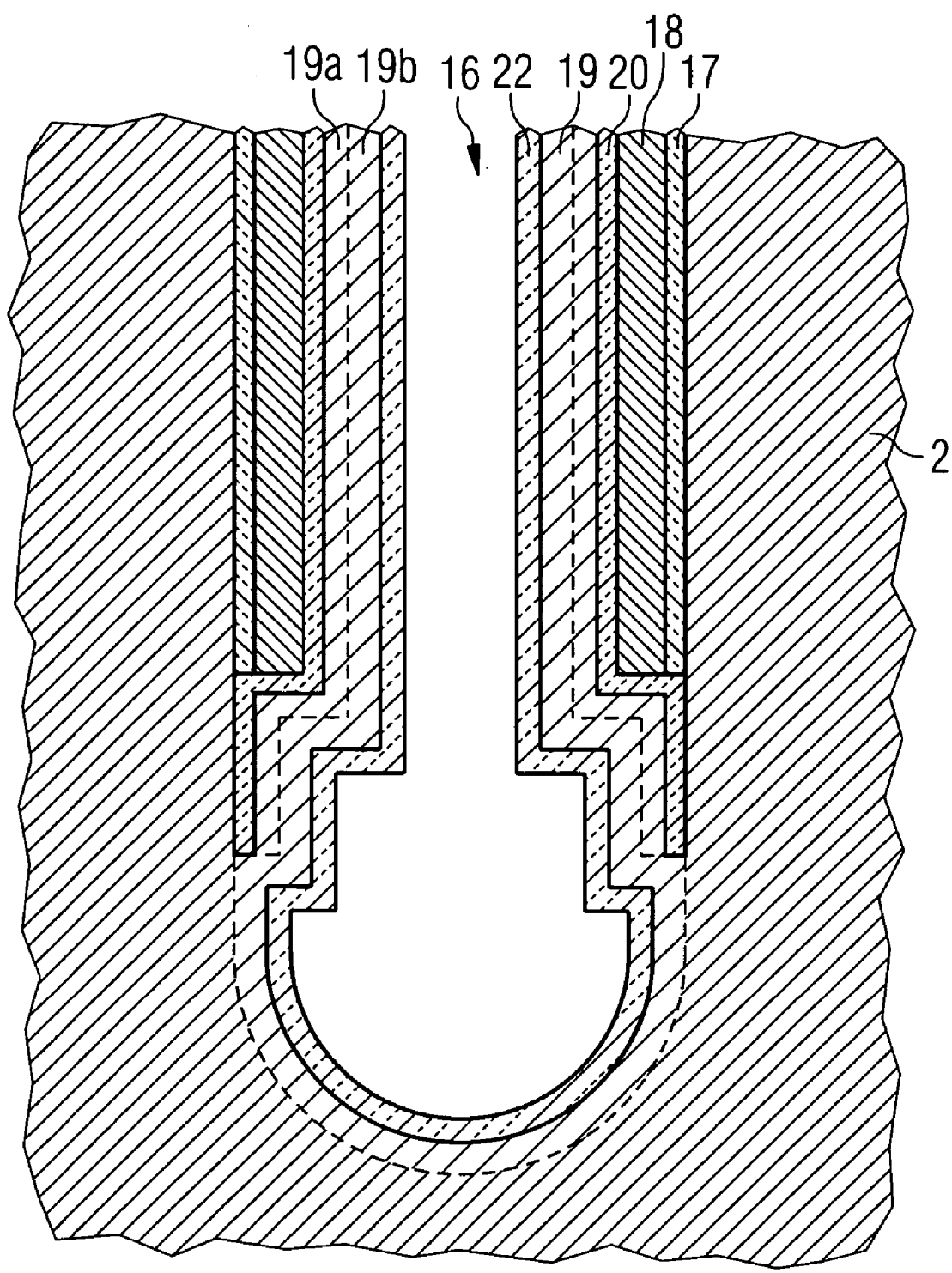
Figure 5G:
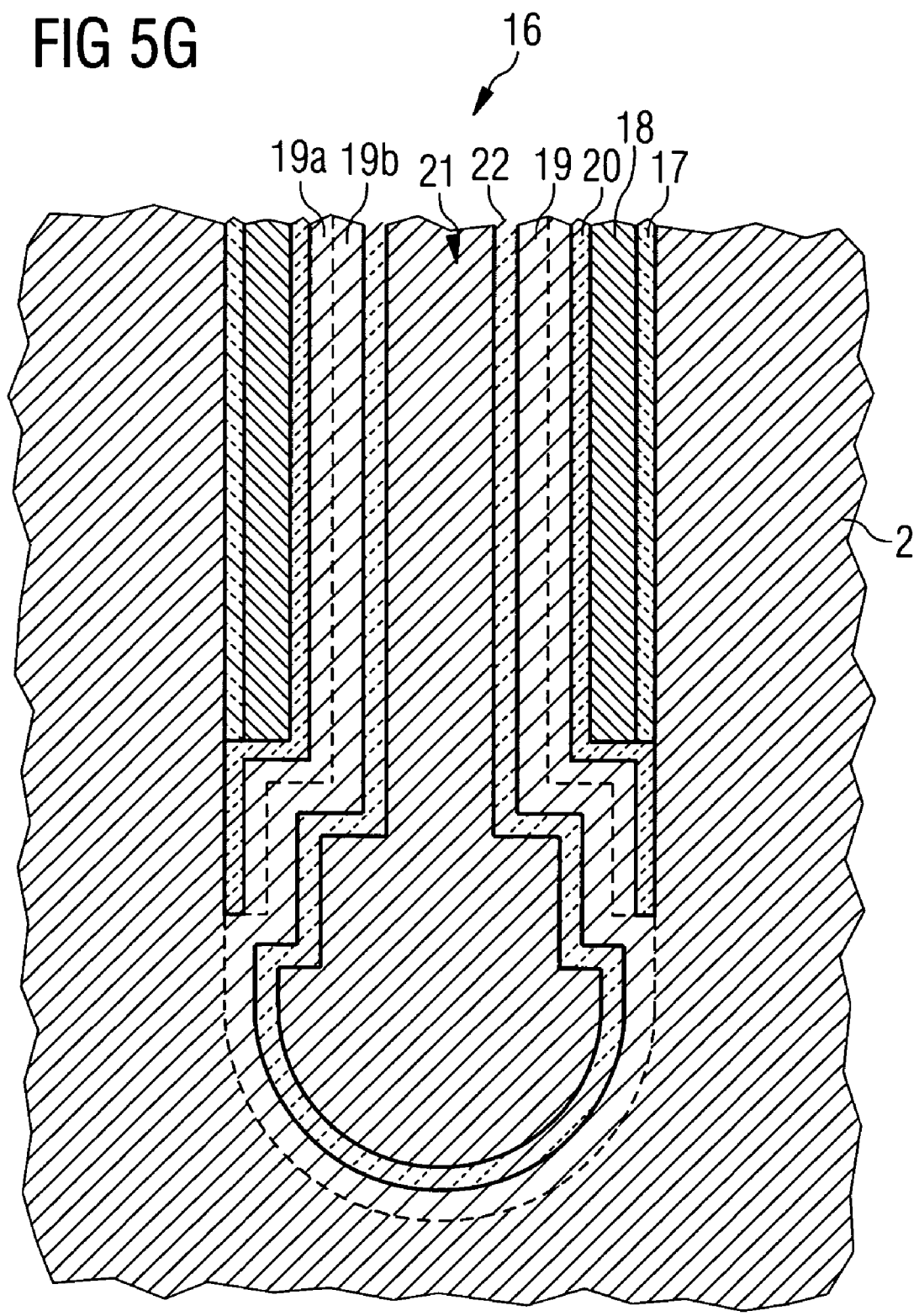

In order to obtain the inner capacitor, as illustrated in FIG. 5F, the second electrode layer 19 is covered with a third dielectric layer 22 over the whole area. Finally, as illustrated in FIG. 5G, the cavity which still remains in the trench 16 is filled with a third electrode layer 21.

All the electrode layers can be applied by means of a conformal deposition process. Suitable methods are, for example, LPCVD (Low Pressure Chemical Vapor Deposition) and ALD.

The layers used as etching masks 31, 32 are composed of $Al_2O_3$, for example. In addition to nonconformal deposition by means of short-time pulses, these layers may also be patterned in such a way that the trench 16 is filled with a resist, for example, in the lower section. Afterward, the layer is deposited conformally with the aid of a low-temperature process and is subsequently patterned to form the first etching mask 31 or second etching mask 32 by means of anistropic etching. Finally, the resist is also removed again from the lower region of the trench.

The essential method steps for the contact connection of the arrangement of capacitors according to the invention fabricated according to the method described above are illustrated in FIG. 6A to N.

FIG. 6A shows the upper section of an arrangement such as is obtained after the above-described method steps for fabricating the capacitor arrangement according to an exemplary embodiment of the invention. The illustration of FIG. 6A therefore corresponds to the upper section of the illustration from FIG. 5G. The individual layers introduced into the trench 16 continue on the surface of the substrate 2. Therefore, first dielectric layer 17, first electrode layer 18, second dielectric layer 20, second electrode layer 19, third dielectric layer 22 and third electrode layer 21 are arranged in the trench 16 and on the surface of the substrate 2. In this illustration, the substrate 2 comprises a layer 2a a made of a semiconductor substrate, generally silicon, and a covering layer 2b, for example made of a silicon oxide or nitride.

Firstly, the inner third electrode layer 21 is removed from the trench 16 as far as a specific structure depth T3, hereby obtaining a cavity 33 open to the substrate top side. This may be done for example by means of a selective isotropic etching method, for example by etching using an isotropic fluorine plasma. The uncovered sections of the third dielectric layer 22 may then be removed, for example by isotropic etching using a solution of a suitable etchant. In the next work step, the uncovered sections of the second electrode layer 19 are removed, for example using a fluorine plasma. As illustrated in FIG. 6B, a cavity 33 is now produced again in the upper section of the trench 16, the lateral walls of which cavity are formed by the second dielectric layer 20 and the lower termination of which cavity is essentially formed by the uncovered areas of the third electrode layer 21 and the second electrode layer 19.

As illustrated in FIG. 6C, a comparatively thick first insulator layer 27 is subsequently applied to all the uncovered areas in the cavity 33 by means of a conformal deposition process. The first insulator layer 27 is deposited by means of a CVD method, for example.

For the patterning of the first insulator layer 27 and the second dielectric layer 20, e.g. a silicon layer 34 is deposited on the first insulator layer 27. As illustrated in FIG. 6D, the silicon layer 34 is then removed again on one side of the cavity 33 with the aid of an ion-assisted etching method (IBE). By virtue of the inclined angle of incidence of the ion beams 35 with respect to the substrate surface, the incident ions impinge on the silicon layer 34 only in sections and it is only there that said silicon layer is removed.

The uncovered sections of the first insulator layer 27 and also the corresponding sections of the second dielectric layer 20 are subsequently removed by isotropic etching, with the result that the arrangement illustrated in FIG. 6E is attained. The insulator layer 27 has been etched back asymmetrically in the cavity 33, i.e. it has a different extent along opposite side walls of the cavity 33. As a result of the asymmetrical etching-back of the insulator layer 27, portions of the first electrode 18 are uncovered again in their upper region in the cavity 33.

The silicon layer 34 and also the first electrode layer 18 are then removed in the uncovered regions by means of an isotropic etching process. The arrangement illustrated in FIG. 6F is obtained. In the trench 16, along the side walls, the first electrode layer 18 exhibits a different extent in the direction perpendicular to the substrate surface. Toward the side of the substrate 2, the first electrode layer 18 is in each case insulated by the first dielectric layer 17. In the direction of the cavity 33, the first electrode layer 18 is insulated by the second dielectric layer 20 and, in the upper trench region, by the first insulator layer 27. The first electrode layer 18 is uncovered only at its upper termination in the direction of the substrate surface.

As shown in FIG. 6G, a second insulator layer 24 is deposited conformally onto all the areas which are uncovered in the cavity 33. The sections of the first electrode layer 18 which are still uncovered in the direction of the opening of the cavity 33 are closed off as a result. The upper termination of the first electrode layer 18 is now set back into the trench to different extents at the two side walls of the trench 16 and is insulated by the dielectric layers 17, 20 and 24.

In the next process step, the third electrode 21 is opened again. For this purpose, sections of the first and second insulator layers 24, 27 which are arranged in the lower region of the cavity 33 on the third electrode layer 21 are removed with the aid of an anisotropic etching process which etches exclusively perpendicularly into the depth. The arrangement illustrated in FIG. 6H is attained in this way. The cavity 33 is set back right into the third electrode layer 21, i.e. the third electrode layer 21 is uncovered at the base of the cavity 33. The first electrode layer 18 and also the upper termination of the second electrode layer 19 are still electrically insulated toward the cavity 33 and toward the third electrode layer 21 by the dielectric layers 21, 27, 24 and 22.

The cavity 33 is then filled with electrode material 36. As a result, the third electrode 21 is lengthened as far as the surface of the construction illustrated and can be routed to the right-hand side in the figure over the right-hand section of the second electrode layer 19. Excess material is removed at the surface of the semiconductor substrate 2 with the aid of a chemical mechanical polishing CMP step, with the result that the construction illustrated in FIG. 6I is attained.

At the substrate top side, the surface 18a of the first electrode layer 18 is uncovered and so is the electrode material 36 uncovered at the substrate surface, an electrical connection to the third electrode layer 21 being effected via said electrode material. The connection of the second electrode layer 19 is effected, as explained above in the case of FIG. 5, in the lower region of the trench 16 or trench capacitor.

In the further process steps, the first electrode layer 18 and also the third electrode layer 21 are electrically connected to electrically active regions of the semiconductor substrate 2. For this purpose, it is necessary to remove corresponding sections of the first dielectric layer 17 which are arranged respectively between electrode layer 18, 21 or 36 and semiconductor substrate 2b.

Figure 6L:
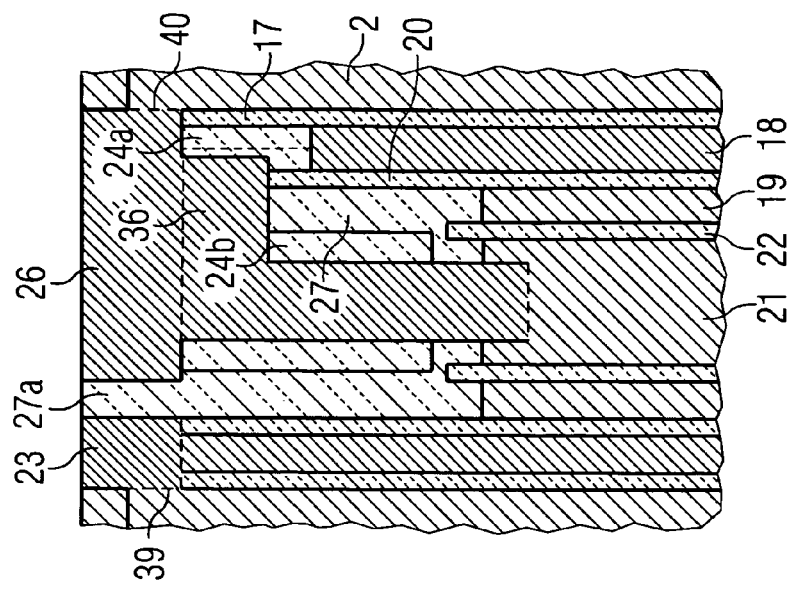
FIG. 6 shows a diagrammatic process sequence for the contact connection of the arrangement of capacitors according to the invention.
Figure 6K:
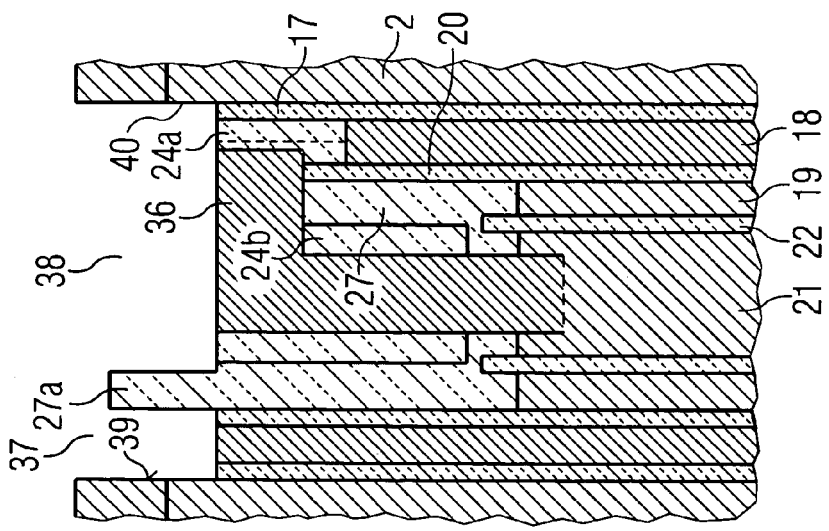
Figure 6J:
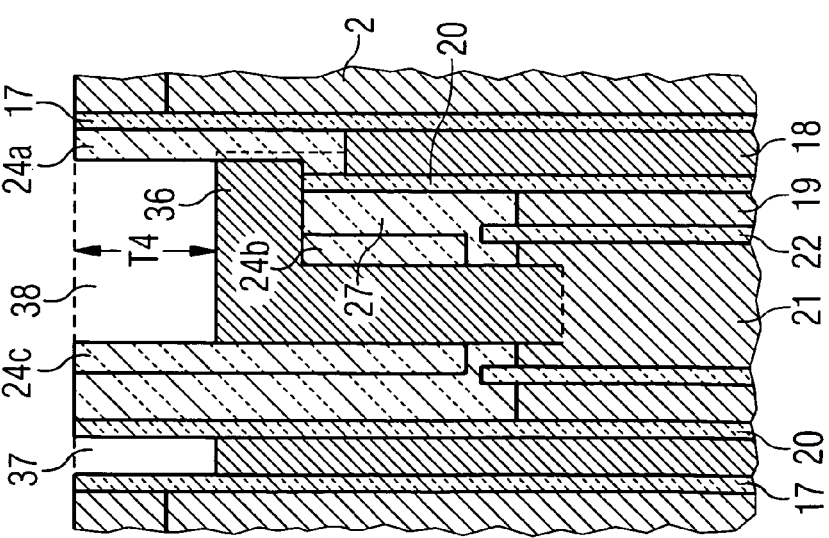

In order to uncover corresponding sections of the first dielectric layer 17 and of the second insulator layer 24, firstly, as illustrated in FIG. 6J, the material of the first electrode layer 18 and, respectively, the electrode material 36 assigned to the third electrode layer 21 are etched back again as far as a structure depth T4, e.g. using a fluorine plasma. The depressions 37 and 38 are obtained, the side walls of which are formed, in the case of the depression 37, by sections of the first dielectric layer 17 and of the second dielectric layer 20 and, in the case of the depression 38, by sections of the second insulator layer 24a, 24c. The lower termination of the depressions 37 and 38 is formed respectively by areas of the first electrode layer 18 and areas of the electrode material 36 assigned to the third electrode layer 21.

The uncovered sections of the dielectric layers 17, 20 and 24a, 24c are then removed by etching, as illustrated in FIG. 6K. In this case, a respective contact area 39 and 40 of the semiconductor substrate 2 is uncovered in the depressions 37 and 38. A section 27a of the first insulator layer 27 remains between the depressions 37, 38.

A layer made of electrode material, preferably polysilicon, is subsequently applied again, thereby filling the depressions 37, 38. Excess material is removed from the substrate surface in a planarization step by means of CMP. As illustrated in FIG. 6L, after the planarization, a conductive section 23 is obtained, which is arranged above the upper termination of the first electrode layer 18, and a conductive section 26 is obtained, which is arranged on the electrode material 36 assigned to the third electrode 21. The sections 23, 26 respectively adjoin, on one side, contact areas 39, 40 of the substrate 2, via which it is possible to effect an electrical connection to, for example, a selection transistor assigned to the respective capacitor. First conductive section 23 and second conductive section 26 are isolated and electrically insulated from one another by the section 27a of the first insulator layer 27.

In order to insulate the first electrode layer 18 and also the third electrode layer 21 toward the substrate surface, the conductive sections 23 and 26 are firstly etched back as far as a structure depth T5, for example in a fluorine plasma. The filling spaces 41 and 42 illustrated in FIG. 6M are obtained.

The filling spaces 41 and 42 are filled with a dielectric, preferably a covering oxide 43. Finally, a further planarization step is carried out. The arrangement of capacitors according to the invention illustrated in FIG. 6N has contacts 39, 40 which are arranged on mutually opposite sides and via which it is possible to produce an electrical connection to the first electrode layer 18 and third electrode layer 21, respectively. The contact 40 to the third electrode layer 21 arranged in the interior is in this case routed out to the right-hand side over the set-back section of the first electrode layer 18 arranged on the right-hand side of FIG. 6N. On the opposite side of the trench, the connection 39 to the first electrode 18 is routed out to the left-hand side in FIG. 6N. Inner and outer capacitors of the capacitor arrangement according to the invention can therefore be driven independently of one another.

The steps illustrated in FIGS. 5 and 6 show certain essential features of the fabrication of the capacitor device according to an exemplary embodiment of the invention. Thus, further insulation layers must also be provided in the upper section of the trench as are customary for trench capacitors, in order to insulate the upper connections to the first electrode layer 18 and to the third electrode layer 21 from the reference potential. Buried collar oxides, in particular, are taken into consideration as collar insulation. SOI (silicon on insulator) wafers may also be used, in which an insulating layer made of a dielectric is provided at a distance from the substrate surface, said layer being penetrated by the capacitor arrangement according to the invention, so that the connections to the first electrode layer 18 and to the third electrode layer 21 are arranged above the dielectric layer, while the connection to the second electrode layer 19 which is at reference potential is arranged below the insulating layer.

The fabrication of a capacitor arrangement according to an embodiment of the invention requires a complex sequence of production steps. Therefore, the invention also relates to a method for fabricating a capacitor arrangement described above.

The capacitor arrangement according to the invention is fabricated by the following procedure:

Firstly, a substrate is provided. A corresponding substrate is selected depending on whether an arrangement is intended to be fabricated as a stacked capacitor or as a trench capacitor. A silicon wafer is generally used in the fabrication of stacked capacitors, the necessary elements for driving the capacitors already being integrated into said silicon wafer. A thick layer made of a dielectric, for example silicon dioxide, or made of polysilicon is applied on the surface of the wafer, the capacitor arrangement according to the invention being integrated into said layer. A silicon wafer is used in the fabrication of trench capacitors, which silicon wafer may be covered on its top side with a dielectric layer comprising, for example, silicon oxide/silicon nitride. A layer which is heavily doped and therefore electrically conductive may be arranged at a distance from the surface of the silicon wafer. This layer serves for putting individual electrodes of the capacitor arrangement at a reference potential. However, a simple silicon wafer may inherently be taken as a basis in the fabrication of the capacitor arrangement in the form of trench capacitors.

Firstly, a trench which is open to the substrate top side is introduced into the substrate. Customary lithography and etching techniques are used to produce the trench. The trench has a high aspect ratio, i.e. its extent perpendicular to the top side of the substrate is significantly greater than its diameter. The aspect ratio is generally chosen to be greater than 20. At the present time, aspect ratios in the range of 30 to 50 are usually realized in memory chips. Even higher aspect ratios in the region of more than 60 are expected for future chip generations. Firstly, a first dielectric layer is shaped on the wall of the trench. In the case of trench capacitors, said first dielectric layer serves, in the completed capacitor arrangement, for insulating the first electrode from the semiconductor substrate surrounding the capacitor arrangement. In the case of stacked capacitors, the first dielectric layer may also be formed by the thick dielectric layer which surrounds the trench and is applied to the semiconductor substrate. As an alternative, firstly a thin electrode layer may be deposited, onto which the first dielectric layer is then deposited. A first electrode layer is applied to the first dielectric layer. Said first electrode layer forms the first electrode in the completed capacitor arrangement. The first electrode layer is applied in such a way that it at least partially covers the first dielectric layer. If the first electrode layer only partially covers the first dielectric layer, a (second) contact to the second electrode may be arranged in the sections not covered by the first electrode layer. A second dielectric layer is then applied, so that the first electrode layer is covered by the second dielectric layer. The first electrode layer is then encapsulated by dielectric layers on both sides. A second electrode layer is then deposited onto the second dielectric layer and a contact of the second electrode layer to the substrate is produced. For this purpose, the procedure may, for example, be such that firstly sections of the second dielectric layer are removed, the substrate being uncovered again in these sections. This procedure is suitable for the fabrication of the capacitor arrangement in an embodiment as a trench capacitor. The second electrode layer is then connected to the (semiconductor) substrate. This ensures that the second electrode is at reference potential in the finished capacitor arrangement. The outer (upper) capacitor has been fabricated in the work steps carried out previously. In order to pattern the inner (lower) capacitor, the second electrode layer is covered with a third dielectric layer and the cavity that still remains is filled with the third electrode layer. A first contact to the first electrode layer and a third contact to the third electrode layer are also fabricated, by means of which the individual electrodes can be driven.

The method is particularly suitable for fabricating a capacitor arrangement which is embodied as an arrangement of trench capacitors. In this case, the trench in the substrate is embodied as a trench in a semiconductor substrate. As already explained, a silicon wafer is preferably used as the semiconductor substrate, which silicon wafer may also already have passed through various processing steps.

In the case of an embodiment as an arrangement of trench capacitors, the first electrode only reaches as far as a predetermined structure depth T1, in order to be able to embody a contact to the second electrode in the lower section of the trench. For this purpose, it is necessary to pattern the first electrode layer in the trench in such a way that it only reaches as far as the structure depth T1. Furthermore, it is necessary to remove the first dielectric layer in the sections in which the (second) contact to the second electrode layer is intended to be fabricated. The first dielectric layer and the first electrode layer are particularly preferably patterned in the following manner.

Firstly, the first dielectric layer is deposited in such a way that it covers all the walls of the trench. The deposition is generally effected from the gas phase, for example by means of an ALD (ALD=Atomic Layer Deposition) or a CVD method (CVD=Chemical Vapor Deposition). The first electrode layer is subsequently applied. The first electrode layer now completely covers the first dielectric layer. In order to be able to remove the first electrode layer again in the sections below the structure depth T1, a layer serving as a first etching mask is then deposited. This first etching mask extends along the trench wall from the upper termination of the trench as far as the predetermined structure depth T1. Methods known to the person skilled in the art are used for fabricating such a first etching mask. Thus, the etching mask may be produced for example by means of a non-conformal ALD method, in which the pulse lengths are chosen such that the trench wall is covered only incompletely, i.e. as far as the predetermined structure depth T1, with the layer serving as an etching mask. However, multistage methods are also possible in which the trench for example is firstly filled with a resist, which is subsequently etched back as far as the predetermined structure depth T1. Afterward, the etching mask is deposited and the residual resist is removed from the lower trench section.

Once the first etching mask has been applied in the desired structure, the first electrode layer and the first dielectric layer are removed in the sections not covered by the first etching mask, so that the substrate is uncovered again in these sections. Finally, the first etching mask is removed. If the second dielectric layer and the second electrode layer are then applied to the trench wall, the (second) contact between second electrode layer and semiconductor substrate may be formed in the lower section of the trench.

The second electrode layer forms the second electrode in the completed capacitor arrangement. In the case of an embodiment as a trench capacitor, the second electrode is routed below the first electrode onto the substrate. In this case, first and second electrodes must be electrically insulated from one another. For this purpose, the second dielectric layer, which electrically insulates the first electrode section from the second electrode section, may be patterned correspondingly.

Preferably, the procedure in this case is as follows. A trench is taken as a basis, in which the first dielectric layer and also the first electrode layer have been patterned in the manner described above. Firstly the second dielectric layer is deposited in the trench, and now covers all the walls of the trench. Methods for deposition from the gas phase, e.g. ALD or CVD methods, are preferably used in this case as well. A first part of the second electrode layer is deposited onto the second dielectric layer, and completely covers the second dielectric layer. Said first part of the second electrode layer has a layer thickness d5, which is less than the final layer thickness of the second electrode layer. A layer serving as a second etching mask is then deposited on the first part of the second electrode layer. Said second etching mask extends along the trench wall from the upper termination of the trench as far as a structure depth T2. The structure depth T2 is defined in the trench below the structure depth T1 and corresponds to that depth of the trench at which the second electrode is routed onto the substrate. The deposition of the second etching mask may be carried out by the same methods as are also used for fabricating the first etching mask. Afterward, the semiconductor substrate is uncovered in the region not covered by the second etching mask, by the removal of corresponding sections of the second dielectric layer. Afterward, the second etching mask is removed and a second part of the second electrode layer is deposited. Said second part of the second electrode layer has a layer thickness d7. Above the structure depth T2, the second part bears on the first part of the second electrode layer and is united with the latter. Above the structure depth T2, the second electrode layer therefore has a layer thickness d5+d7. Below the structure depth T2, the second part of the second electrode layer makes direct contact with the semiconductor substrate and forms the second contact in the sense of the invention.

Then, as already described, the third dielectric layer is applied to the second electrode layer and the remaining cavity is filled with electrode material in order to obtain a third electrode layer.

The layers serving as first and second etching masks are preferably deposited by nonconformal atomic layer deposition (ALD). In the ALD method, monomolecular layers of reactants are deposited in each case. If the quantity of reactant is limited for example by short-time pulses by means of which the reactant is introduced into a reaction chamber, the trench wall is covered only incompletely. After the trench wall is continuously covered with the reactant progressing downward proceeding from the upper edge adjoining the substrate top side, the extent of the layer into the depth of the trench can be controlled by the length of the short-time pulses, so that the layer acting as first or second etching mask extends only as far as a predetermined structure depth T1 or T2.

The first, second and third electrode layer is generally produced by means of customary conformal deposition processes, for example by means of an ALD or a CVD method.

Instead of patterning the dielectric layers or the electrode layers with the aid of a nonconformally deposited etching mask, said layers may also themselves be deposited directly by means of a nonconformal ALD process such that they extend as far as the structure depth T1 or T2. This obviates the deposition of the etching masks and also the etching processes.

In this case, the procedure is such that the second contact is produced between second electrode layer and substrate by a procedure in which the first dielectric layer is deposited by a nonconformal method, so that the trench wall is covered as far as a structure depth T1, the first electrode layer is deposited on the first dielectric layer by a nonconformal method, so that the first electrode layer essentially extends as far as a structure depth T1, the first electrode layer not touching sections of the trench wall which are formed by the semiconductor substrate below the structure depth T1;

the second dielectric layer is deposited by a nonconformal method, so that the trench wall is covered as far as a structure depth T2 and sections of the trench wall below the structure depth T2 are formed by the semiconductor substrate, and the second electrode layer is applied on the trench wall.

For the fabrication of the contacts to the various electrode layers, the construction of the capacitor arrangement in the upper section of the trench adjoining the substrate top side is modified in such a way that the contact to the third electrode, arranged in the interior of the capacitor arrangement, can be routed in an electrically insulated manner to the outer side of the arrangement.

Preferably, for this purpose, firstly the third electrode layer, the third dielectric layer and the second electrode layer are removed as far as a structure depth T3. The structure depth T3 is defined between the opening of the trench at the substrate top side and the structure depth T1. A cavity open to the substrate top side is obtained in the upper section of the trench, the side walls of which cavity are formed by sections—arranged on the trench wall—of the first electrode layer with a dielectric layer situated thereon and the lower area of which cavity is formed by areas which correspond to the upper termination of the third electrode layer, the third dielectric layer and the second electrode layer. A first insulation layer is subsequently applied on the areas of the cavity. Said first insulation layer is composed of a suitable dielectric. Its layer thickness is generally chosen to be greater than the thickness of the first, second and third dielectric layers. The first insulation layer can be applied by means of a conformal deposition process, for example a CVD or ALD method.

The first insulation layer, the second dielectric layer and the first electrode layer are then removed in sections in order to provide, at a side area of the cavity, a section in which the semiconductor substrate is uncovered. In this case, areas are uncovered at the upper termination of the first electrode layer, which areas are subsequently electrically insulated again by deposition of a second insulation layer. For this purpose, the second insulation layer is applied on all the areas of the cavity.

In order to be able to produce a contact to the third electrode, a section of the first and second insulating layers is firstly removed on the lower area of the cavity opposite to the opening of the cavity, thereby obtaining a section in which the third electrode layer is uncovered.

The cavity is then filled with electrode material. Excess material may be removed again, if appropriate, at the surface of the semiconductor substrate. This may be done for example by means of a CMP method (CMP=Chemical Mechanical Polishing). The third electrode layer is lengthened by the filled-in electrode material as far as the substrate surface.

In order to fabricate a first contact to the first electrode and also a third contact to the third electrode, sections of the dielectric layers arranged between the respective electrode layer and the semiconductor substrate are removed and an electrically conductive connection between first or third electrode layer and semiconductor substrate is fabricated in each case.

Preferably, for this purpose, the first or third electrode layer is partially etched back again, thereby obtaining a depression which reaches as far as the structure depth T4 and the side walls of which are formed by dielectric layers. The structure depth T4 is defined between the structure depth T3 and the substrate top side. The dielectric layers uncovered at the side walls are removed in sections. Sections in which the semiconductor substrate is uncovered are thereby obtained. Afterward, a layer made of electrode material is applied again. This layer produces a contact between semiconductor substrate and first or third electrode.

Afterward, a planarization step may also be carried out in order to remove excess electrode material on the substrate top side. The first and third electrode layers may also be etched back in order to provide a filling space, which is filled with a dielectric in order to insulate the capacitor arrangement toward the substrate top side. For this purpose, the previously applied layer made of electrode material is etched back as far as a structure depth T5 defined between the structure depth T4 and the substrate surface. A filling space is obtained, which is filled with a dielectric. Finally, a further planarization step may also be carried out.

As described above, for the fabrication of the first contact to the first electrode layer and the third contact to the third electrode layer, at a side area of the cavity, a section is provided in which the semiconductor substrate is uncovered. For this purpose, preferably, firstly the first insulation layer and the second dielectric layer are removed in this section.

Preferably, for this purpose, the procedure is such that a layer which covers the first insulation layer in the interior of the cavity and serves as an etching mask is deposited. The layer serving as an etching mask is subsequently removed on a side area of the cavity in a section. Silicon is preferably used as material for the etching mask. The first insulation layer and the second dielectric layer are then removed in the sections not covered by the etching mask. Finally, the etching mask is also removed again.

When silicon is used as material for the etching mask, it is possible to remove the silicon layer on a section of the side area of the cavity by directing an ion beam onto the section to be removed. The ion beam removes the silicon layer in these sections (ion beam etching, IBE). However, aluminum oxide, for example, may also be used as a mask, the aluminum oxide layer firstly being subjected to heat treatment after the deposition. If an ion beam is then directed onto the sections to be removed, the structure of the oxide layer is altered by ion implantation in such a way that the sections on which the ion beam has impinged can subsequently be removed selectively. The selective removal may be carried out for example by means of a wet-chemical etching method. Such etching methods are known to the person skilled in the art.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. An arrangement of at least two capacitors, the capacitor arrangement comprising:
    at least two capacitors arranged one in the other such that an outer capacitor at least partially encloses at least one inner capacitor, the outer capacitor and the inner capacitor being arranged concentrically one in the other and comprising, from the outside inward, a first dielectric layer having a thickness d1, a first electrode layer having a thickness d2, a second dielectric layer having a thickness d4, a second electrode layer having a thickness d5+d7, a third dielectric layer having a thickness d8 and an inner third electrode layer;
    wherein the second electrode layer is at reference potential;
    wherein the at least two capacitors are disposed in or on a semiconductor substrate;
    wherein the outer capacitor and the inner capacitor have the same capacitance;
    wherein the capacitor arrangement is formed as an arrangement of trench capacitors; and
    wherein the first electrode layer extends above a structure depth T1 along the wall of the trench and the second electrode layer is routed below the structure depth T1 onto the semiconductor substrate.

2. The arrangement as in claim 1, wherein the capacitors have an elliptical or circular cross section.

3. The arrangement as in claim 1, wherein the first, the second and the third dielectric layers have the same thickness.

4. The arrangement as in claim 1, wherein the capacitor arrangement is disposed within a trench in the semiconductor substrate, the arrangement further comprising a first contact to the first electrode layer and a third contact to the third electrode layer, first and third contacts being arranged at opposite sides of a periphery of the trench.

5. The arrangement as in claim 4, wherein the first contact to the first electrode layer is arranged at an upper termination of the first electrode layer, wherein the upper termination of the first electrode layer is set back with respect to a surface of the substrate at a side of the trench periphery opposite to the first contact, so that a section that is not covered by the first electrode is obtained near the upper termination of the trench wall, and the third contact to the third electrode layer is routed through said section over the upper termination of the first electrode layer to outside of the capacitor arrangement.

6. An arrangement of two capacitors in a semiconductor substrate, in which an outer capacitor and an inner capacitor are arranged one in the other and the following are provided, from the outside inward:
   a first dielectric layer, a first electrode layer, a second dielectric layer, a second electrode layer, a third dielectric layer and an inner third electrode layer,
   wherein the first electrode layer extends only above a structure depth T1 along the wall of a trench provided in the substrate, where the structure depth is measured from the surface of the substrate and T1 is smaller than the depth of the trench,
   and the second electrode layer is routed below the structure depth T1 onto the semiconductor substrate and is at reference potential.

7. The arrangement as in claim 6, wherein the outer and inner capacitors have an elliptical or circular cross section.

8. The arrangement as in claim 6, wherein the outer capacitor and the inner capacitor have the substantially same capacitance.

9. The arrangement as in claim 6, wherein the capacitors are arranged concentrically.

10. The arrangement as in claim 6, wherein the outer capacitor and the inner capacitor have the same thickness.

11. The arrangement as in claim 10, further comprising a first contact to the first electrode layer and a third contact to the third electrode layer, first and third contacts being arranged at opposite sides of a periphery of the trench.

12. The arrangement as in claim 11, wherein the first contact to the first electrode layer is arranged at an upper termination of the first electrode layer, wherein the upper termination of the first electrode layer is set back with respect to a surface of the substrate at a side of the trench periphery opposite to the first contact, so that a section that is not covered by the first electrode is obtained near the upper termination of the trench wail, and the third contact to the third electrode layer is routed through said section over the upper termination of the first electrode layer to outside of the capacitor arrangement.

13. A capacitor arrangement comprising:
   a semiconductor substrate;
   a trench formed within the semiconductor substrate;
   an inner electrode region disposed within the trench;
   a first dielectric layer surrounding the inner electrode region;
   a first electrode layer surrounding the first dielectric layer and extending along the inner electrode far a first distance;
   a second dielectric layer surrounding the first electrode layer;
   a second electrode layer surrounding the second dielectric layer and extending along the inner electrode for a second distance, the second distance being smaller than the first distance; and
   a third dielectric layer surrounding the second electrode layer;
   wherein the first dielectric, the first electrode layer, the second dielectric layer, the second electrode, and the third dielectric layer form an outer capacitor and an inner capacitor that are arranged concentrically within one in the other; and
   wherein the first, the second and the third dielectric layers have the same thickness.

14. The arrangement as in claim 13, wherein the first dielectric, the first electrode layer, the second dielectric layer, the second electrode, and the third dielectric layer are all disposed within a trench that is within a semiconductor region.

15. The arrangement as in claim 14, wherein the first electrode is electrically coupled to the semiconductor region.

16. The arrangement as in claim 15, wherein the first electrode is electrically coupled to the semiconductor region at a portion of the semiconductor region vertically below the second electrode.

17. The arrangement as in claim 15, wherein the first electrode is electrically coupled to a reference potential.

18. The arrangement as in claim 14, further comprising a first contact to the second electrode layer and a third contact to the inner electrode, the first and third contacts being arranged at opposite sides of a periphery of the trench.

19. The arrangement as in claim 18, wherein the first contact to the first electrode layer is arranged at an upper termination of the first electrode layer, wherein the upper termination of the first electrode layer is set back with respect to a surface of the substrate at a side of the trench periphery opposite to the first contact, so that a section that is not covered by the first electrode is obtained near an upper termination of the trench wall, and wherein the third contact to the third electrode layer is routed through said section to outside of the capacitor arrangement.

20. The arrangement as in claim 13, wherein the first electrode is electrically coupled to a reference potential.

21. The arrangement as in claim 13, wherein the outer and inner capacitors have an elliptical or circular cross section.

22. An arrangement of two capacitors in a substrate, in which an outer capacitor and an inner capacitor are arranged one in the other and the following are provided, from the outside inward:
   a first dielectric layer, a first electrode layer, a second dielectric layer, a second electrode layer, a third dielectric layer and an inner third electrode layer,
   wherein the first electrode layer extends only above a structure depth T1 along the wall of a trench provided in the substrate,
   wherein the second electrode layer is routed below the structure depth T1 onto the semiconductor substrate and is at reference potential, and
   wherein the outer and inner capacitors have an elliptical or circular cross section.

* * * * *